United States Patent
Kudo

(10) Patent No.: US 9,136,761 B2
(45) Date of Patent: Sep. 15, 2015

(54) SEMICONDUCTOR DEVICE AND POWER SUPPLY DEVICE

(71) Applicant: RENESAS ELECTRONICS CORPORATION, Kawasaki-shi, Kanagawa (JP)

(72) Inventor: Ryotaro Kudo, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 213 days.

(21) Appl. No.: 13/793,480

(22) Filed: Mar. 11, 2013

(65) Prior Publication Data

US 2014/0035551 A1 Feb. 6, 2014

Related U.S. Application Data

(63) Continuation of application No. 12/897,137, filed on Oct. 4, 2010, now Pat. No. 8,400,121.

(30) Foreign Application Priority Data

Oct. 30, 2009 (JP) ................................ 2009-249704

(51) Int. Cl.
*H02M 3/335* (2006.01)
*H02M 3/158* (2006.01)
*H01L 23/00* (2006.01)

(52) U.S. Cl.
CPC ............... *H02M 3/158* (2013.01); *H01L 24/34* (2013.01); *H02M 3/1584* (2013.01); *H01L 2224/32245* (2013.01); *H01L 2224/48137* (2013.01); *H01L 2224/48247* (2013.01); *H01L 2224/73221* (2013.01); *H01L 2224/73265* (2013.01); *H01L 2924/12032* (2013.01); *H01L 2924/1306* (2013.01); *H01L 2924/13091* (2013.01); *H01L 2924/3011* (2013.01); *H01L 2924/3025* (2013.01); *H01L 2924/30107* (2013.01)

(58) Field of Classification Search
USPC ......... 323/222, 271–277, 282–289, 351, 266; 363/49, 56.01, 65, 89, 97

See application file for complete search history.

(56) References Cited

U.S. PATENT DOCUMENTS

| 5,325,258 | A  | * | 6/1994  | Choi et al. ....................... 361/87  |
| 5,841,643 | A  | * | 11/1998 | Schenkel .................... 363/21.13 |
| 6,465,993 | B1 | * | 10/2002 | Clarkin et al. ................. 323/272 |
| 6,771,052 | B2 |   | 8/2004  | Ostojic |
| 6,912,144 | B1 |   | 6/2005  | Clavette |
| 7,009,369 | B2 |   | 3/2006  | Ni et al. |

(Continued)

FOREIGN PATENT DOCUMENTS

JP 2006-50891 A 2/2006
JP 2008-17620 A 1/2008

*Primary Examiner* — Rajnikant Patel
(74) *Attorney, Agent, or Firm* — Mattingly & Malur, PC

(57) ABSTRACT

The present invention realized miniaturization of a power supply device using a multiphase system. The power supply device includes, for example, a common control unit, a plurality of PWM-equipped drive units, and a plurality of inductors. The common control unit outputs clock signals respectively different in phase to the PWM-equipped drive units. The clock signals are controllable in voltage state individually respectively. For example, the clock signal can be brought to a high impedance state. In this case, the PWM-equipped drive unit detects this high impedance state and stops its own operation. It is thus possible to set the number of phases in multiphase arbitrarily without using another enable signal or the like.

8 Claims, 27 Drawing Sheets

(56) References Cited

U.S. PATENT DOCUMENTS

| | | |
|---|---|---|
| 7,026,798 B2 * | 4/2006 | Cheung et al. ............... 323/225 |
| 7,492,136 B2 * | 2/2009 | Schuellein .................... 323/272 |
| 7,492,615 B2 * | 2/2009 | Morota et al. ............. 363/21.16 |
| 8,115,461 B2 * | 2/2012 | Yoshio ......................... 323/266 |

\* cited by examiner

PROBLEM-FREE CASE (VIN RISES EARLY)

PROBLEM CASE (VIN RISES LATE)

SEMICONDUCTOR DEVICE AND POWER SUPPLY DEVICE

CROSS-REFERENCE TO RELATED APPLICATIONS

This application is a continuation of U.S. patent application Ser. No. 12/897,137, filed Oct. 4, 2010, which claims priority to Japanese Patent Application No. 2009-249704 filed on Oct. 30, 2009, the disclosure of which, including the specification, drawings and abstract, is incorporated herein by reference in its entirety.

BACKGROUND OF THE INVENTION

The present invention relates to a semiconductor device and a power supply device using the same, and to, for example, a technology effective for application to a switching power supply device for converting a high voltage to a low voltage.

A semiconductor device in which power MOSFETs, drive circuits for driving them, and a control circuit for transferring switching control signals to the drive circuits are mounted into one package, has been described in, for example, a patent document 1 (Japanese Unexamined Patent Publication No. 2008-17620) (refer to FIGS. 1(a) and 1(b) and FIGS. 2(a) and 2(b)). The semiconductor device is capable of multiphase operation (refer to FIG. 15).

A multiphase DC/DC converter device for supplying power to a load in phases respectively different from one another, using a plurality of converter control ICs has been described in a patent document 2 (Japanese Unexamined Patent Publication No. 2006-50891) (refer to FIGS. 1(a) and 1(b)).

SUMMARY OF THE INVENTION

Various types of electronic equipment and electrical apparatuses each typified by, for example, a personal computer (hereinafter described as "PC") are respectively equipped with an AC/DC converter (e.g., ATX power supply) which generates a desired dc voltage (e.g., 12V, 5V, 3.3V or the like) from an ac voltage (e.g., 100V or the like) used as a commercial power source. A notebook-size PC or the like is supplied with a dc voltage of a specific value by a battery. Various kinds of semiconductor parts employed in the PC or the like need a stable power supply voltage and needs a plurality of power supply voltage values as the case may be. Therefore, the voltage generated by the AC/DC converter or battery is converted into a predetermined voltage (e.g., 1.0V or the like) and a stable voltage by a buck non-insulated type DC/DC converter (buck converter), which in turn is supplied to the various types of semiconductor parts. These are generally called POL (point of load) converters or the like. In the case of the PC, for example, it is mounted over a PCB (Printed Circuit Board) like a motherboard or various kinds of expansion boards (graphic board or the like) in the vicinity of various kinds of circuit units (CPU (Central Processing Unit), GPU (Graphics Processing Unit), memory, etc.).

The demand for an increase in current, fast responding and stabilization is recently increasing in such a buck converter with a reduction in the voltage of each of the various semiconductor parts and its speeding up. In order to meet such a demand, a multiphase technology for supplying electrical charges from a plurality of inductors to a common capacitor in phases respectively different from one another has been used as shown in the patent documents 1 and 2 or the like.

Since a ripple voltage is reduced in principle as the number of phases increases where the multiphase technology is used, and the amount of load current may be supplied from each inductor in dispersed form, coping with the increase in current becomes also easy. Since the value of each inductor can be made low, it is possible to cope with the fast responding too.

A problem, however, arises in that when the multiphase technology is used, the number of parts that configure the buck converter increases, and the number of wirings between the respective parts increases with such an increase. FIGS. 22(a) and 22(b) show a power supply device discussed as the premise of the present invention, wherein FIG. 22(a) is a schematic diagram showing its configuration example, and FIG. 22(b) is a schematic diagram showing an internal configuration example of a drive unit DRIC' in FIG. 22(a). The power supply device shown in FIG. 22(a) comprises a PWM (Pulse Width Modulation) control unit PWMCTLU, a plurality (six herein) of drive units DRIC'[1] through DRIC'[6], a plurality of inductors L[1] through L[6], resistors R[1] through R[6] and capacitors C[1] through C[6].

The PWM control unit PWMCTLU outputs PWM signals PWM[n] and enable signals EN[n] to the respective drive units DRIC'[n] (where n=1 to 6). Here, the PWM signals PWM[n] and PWM[n+1] are different by 60° in phase from each other. As shown in FIG. 22(b), the drive unit DRIC'[n] includes control logic LGCa, drivers DRVh and DRVl, and power transistors QH and QL. The power transistors QH and QL make use of N type power MOSFETs (Metal Oxide Semiconductor Field Effect Transistors) herein. The power transistor QH has a drain coupled to an input power supply voltage VIN (e.g., 12V or the like), a gate coupled to the driver DRVh, and a source coupled to an external terminal (output terminal) PN2 (SW[n]), respectively. The power transistor QL has a drain coupled to the external terminal PN2 (SW[n]), a gate coupled to the driver DRVl, and a source coupled to a ground power supply voltage GND, respectively. The control logic LGCa drives the power transistor QH via the driver DRVh in response to the corresponding PWM signal PWM[n] and drives the power transistor QL via the driver DRVl in accordance with a complementary signal of the PWM signal PWM[n].

Each inductor L[n] has one end coupled commonly to an output power supply node VO, and the other end coupled to the external terminal (output terminal) PN2 which serves as a terminal for generating a switch signal SW[n]. Accordingly, the respective drive units DRIC'[n] supply energy to their own corresponding inductors L[n] in phases respectively different from one another in accordance with the PWM signals PWM[n] and generates a predetermined power supply (e.g., voltage of 1V) at the output power supply node VO in accordance with PWM operations of six phases with its supply. A load LOD corresponding to the various kinds of circuit units is driven by the power supply of the output power supply node VO. On the other hand, a current flowing through each inductor L[n] is detected by a resistor R[n] and a capacitor C[n] series-coupled between both ends of the inductor L[n] and is fed back to the PWM control unit PWMCTLU as a pair of current detection signals CS[n] (+/−). The PWM control unit PWMCTLU receives the pair of current detection signals CS[n] (+/−), and an output voltage detection signal FB fed back from the output power supply node VO and controls a duty of each PWM signal PWM[n], coupled with a current balance at each inductor L[n].

It is desirable that the power supply device equipped with such a multiphase function is configured in such a manner that the number of phases can be changed depending on power consumption on the load LOD in terms of power conversion efficiency or the like. Therefore, the PWM control unit PWM-CTLU outputs the enable signals EN[n] to their corresponding drive units DRIC'[n] to thereby enable the setting of the number of phases. For example, when the enable signals EN[1], EN[3] and En[5] are made active, PWM operations of three phases (0°, 120° and 240°) are performed by the drive units DRIC'[1], DRIC'[3] and DRIC'[5].

When such a power supply device as shown in FIGS. 22(a) and 22(b) is used here, four (PWM[n], EN[n] and CS[n] (+/−)) wirings are required per phase as is understood from FIG. 22(a). In the case of, for example, 6 phases (n=6), 24 wirings are required, whereas in the case of 8 phases (n=8), 32 wirings are required. It is therefore considered that such a power supply device as shown in FIGS. 25(a) and 25(b) by way of example is used to reduce the number of wirings. FIGS. 25(a) and 25(b) show another power supply device discussed as the premise of the present invention, in which FIG. 25(a) is a schematic diagram showing a configuration example thereof, and FIG. 25(b) is a schematic diagram showing an internal configuration example of a PWM-equipped drive unit PSIP' in FIG. 25(a), respectively.

The power supply device shown in FIG. 25(a) comprises a microcontroller unit MCU, an analog companion unit ACU, a plurality (six herein) of PWM-equipped drive units PSIP' [1] through PSIP' [6], and a plurality of inductors L [1] through L [6]. The microcontroller unit MCU outputs clock signals CLK[n] and enable signals EN[n] to the PWM-equipped drive units PSIP'[n] (where n=1 to 6). Here, the clock signals CLK[n] and CLK[n+1] are different by 60° in phase from each other. The analog companion unit ACU is equipped with an error amplifier EA, which outputs a common error amplifier signal EO to the respective PWM-equipped drive units PSIP'[n] through an error bus EB.

As shown in FIG. 25(b), each PWM-equipped drive unit PSIP'[n] includes a PWM controller PWM_CTL, control logic LGCb, drivers DRVh and DRVl, and power transistors QH and QL. The PWM controller PWM_CTL generates a PWM signal PWM[n] in accordance with a peak current control system using a clock signal CLK[n], an error amplifier signal EO and a current signal detected inside itself. The control logic LGCb drives the power transistors QH and QL through the drivers DRVh and DRVl using the PWM signal PWM[n] in a manner similar to the control logic LGCa of FIGS. 22(a) and 22(b) and thereby drives an external terminal (output terminal) PN2 (SW[n]). Thus, in a manner similar to FIGS. 22(a) and 22(b), the PWM-equipped drive units PSIP' [n] supply energy to their own corresponding inductors L[n] in different phases respectively in accordance with the PWM signals PWM[n] and respectively generate a predetermined power supply at an output power supply node VO by PWM operations of six phases associated with the supply of the energy. The voltage at the output power supply node VO is fed back to the analog companion unit ACU as an output voltage detection signal FB, which is reflected in the error amplifier signal EO through the error amplifier EA.

When such a power supply device as shown in FIGS. 25(a) and 25(b) is used, the resistors R[n], capacitors C[n] and current detection signals CS[n] (+/−) in FIGS. 22(a) and 22(b) become unnecessary because the respective PWM-equipped drive units PSIP'[n] detect the current signals inside themselves and generate the PWM signals PWM[n] as compared with the power supply device shown in FIGS. 22(a) and 22(b). In a manner similar to FIGS. 22(a) and 22(b), however, the enable signals EN[n] set for every phase are still required. Accordingly, two (CLK[n] and EN[n]) wirings per phase and one wiring (error bus EB) common to each phase in addition to them are required in the configuration shown in FIG. 25(a). For example, thirteen wirings are required in the case of six phases (n=6), and seventeen wirings are required in the case of eight phases (n=8).

Using such a power supply device as shown in FIGS. 25(a) and 25(b) in this way makes it possible to reduce the number of wirings to some extent as compared with FIGS. 22(a) and 22(b). However, power consumed or used up by the circuit unit which serves as the load, tends to increase more and more with speed enhancement. On the other hand, the mounting area of a printed circuit board (PCB) or the like tends to decrease more and more with miniaturization of electrical appliances (notebook-size PC, various mobile devices, etc. in particular). Although an increase in the number of phases can then cope with the increase in the power consumption, a layout on the PCB becomes increasingly difficult due to it. Therefore, even such a power supply device as shown in FIGS. 25(a) and 25(b) does not sufficiently meet a demand for the number of wirings.

Described concretely, assuming that the mounting area allocated to the power supply device on the printed circuit board (PCB) is limited, for example, the following problems arise. Firstly, the layout per se of wiring patterns becomes difficult with an increase in the number of wirings. Secondly, the areas of power planes (e.g., the ground power supply voltage GND and output power supply node VO) on the PCB are restricted with the increase in the number of wirings. Since the resistance value of each power plane (typically a Cu wiring) increases in doing so, a reduction in power conversion efficiency occurs. Further, since the area of each radiation pattern is made smaller, an increase in the generated heat occurs. Thirdly, since a plurality of wiring patterns run long parallel to each other on the PCB, noise such as wiring mutual crosstalk or the like is generated.

Accordingly, it is very important for a multiphase power supply device in particular to reduce the number of wirings per phase wherever possible. It is desirable to reduce the number of pins employed in a package for the drive units DRIC'[n] and PWM-equipped drive units PSIP'[n] requiring the number corresponding to the number of phases in particular even from a device's cost viewpoint in addition to the viewpoint of such a mounting problem.

One of objects of the present invention is therefore to realize miniaturization of a power supply device using a multiphase system. Incidentally, the above, other objects and novel features of the present invention will become apparent from the description of the present specification and the accompanying drawings.

A summary of an exemplary embodiment of the inventions disclosed in the present application will be explained in brief as follows:

A power supply device according to the present embodiment comprises a plurality of drive units which supply energy to respective inductors in a multiphase form, and a common control unit. The common control unit outputs controls signals transitioned in phases respectively different from one another to the drive units. Each drive unit includes power transistors which supply energy to its corresponding inductor, a PWM control circuit which PWM-controls the power transistors, and a detection circuit. The detection circuit determines a voltage state of the control signal output from the common control unit in response to the control signal and thereby generates an internal control signal and an enable signal. The voltage state may desirably be a high impedance state, for example. In some cases, the voltage state may be either high-level fixation or low-level fixation. When the high impedance state is detected by the detection circuit, for example, the detection circuit inactivates the enable signal and fixes the internal control signal to a high level or a low level. When the enable signal is being inactivated, the PWM control circuit fixes the power transistors to off. When the enable signal is being activated, the PWM control circuit PWM-controls the power transistors in accordance with the internal control signal.

Using such a configuration makes it possible to transmit an enable signal along with a signal (e.g., a clock signal or a PWM signal as the case may be) which becomes the basis for PWM control by one control signal. That is, while each drive unit in which the enable signal has been inactivated, is capable of arbitrarily changing the number of phases in multiphase to stop a PWM control operation, the function conducted between the common control unit and each drive unit can be realized by a less number of wirings. It is thus possible to realize miniaturization of the power supply device.

In the power supply device according to the present embodiment, the common control unit is equipped with an error amplifier circuit. An error amplifier signal output from the error amplifier circuit is supplied to each drive unit by a common bus. Each of the drive units determines a duty in PWM control, based on the error amplifier signal. The drive unit is also equipped with a voltage detection circuit which detects that a power supply voltage supplied to each power transistor has reached a predetermined voltage. If a power supply voltage for the common control unit rises ahead of a power supply voltage supplied to each drive unit at the start of operation of the power supply device herein, then the common control unit controls the drive unit in such a manner that the drive unit performs a so-called soft start operation through the error amplifier circuit. When, however, the power supply voltage supplied to each drive unit does not rise at this stage, the soft start operation does not function. Therefore, a wired logic circuit is build up which inputs a voltage detection signal from the voltage detection circuit lying in each drive unit, using the common bus.

Thus, the common control unit can start the soft start operation when the power supply voltages for all the drive units have risen. Incidentally, when such a wired logic circuit is not used, for example, there is a need to pull or extract the voltage detection signals through their corresponding wirings, thus resulting in an increase in the number of wirings. Using the wired logic circuit, however, makes it possible to prevent it. It is thus possible to realize miniaturization of the power supply device.

Advantageous effects obtained by an exemplary embodiment of the inventions disclosed in the present application will be explained in brief. The characteristics of a semiconductor device and a power supply device using a multiphase system can be improved, and in particular, miniaturization thereof can be materialized.

BRIEF DESCRIPTION OF THE DRAWINGS

FIGS. 1(a) and 1(b) show a power supply device according to a first embodiment of the present invention, in which FIG. 1(a) is a schematic diagram illustrating a configuration example thereof, and FIG. 1(b) is a schematic diagram depicting an internal configuration example of a PWM-equipped drive unit in FIG. 1(a);

FIGS. 19(a) and 19(b) show a configuration example taken where the power supply device of FIG. 13 is mounted over a printed circuit board, in which FIG. 19(a) is a cross-sectional view showing part of wiring layers at the printed circuit board, and FIG. 19(b) is a plan view showing a layout example of the respective wiring layers shown in FIG. 19(a);

FIGS. 20(a) and 20(b) show a configuration example taken where the power supply device of FIG. 13 is mounted over the printed circuit board, in which FIG. 20(a) is a cross-sectional view showing part of the wiring layers at the printed circuit board, and FIG. 20(b) is a plan view showing a layout example of the respective wiring layers shown in FIG. 20(a);

FIGS. 22(a) and 22(b) show a power supply device discussed as the premise of the present invention, in which FIG. 22(a) is a schematic diagram showing a configuration example thereof, and FIG. 22(b) is a schematic diagram showing an internal configuration example of a drive unit shown in FIG. 22(a);

FIGS. 25(a) and 25(b) show another power supply device discussed as the premise of the present invention, in which FIG. 25(a) is a schematic diagram showing a configuration example thereof, and FIG. 25(b) is a schematic diagram showing an internal configuration example of a PWM-equipped drive unit shown in FIG. 25(a);

DETAILED DESCRIPTION OF THE PREFERRED EMBODIMENTS

Figure 1A:
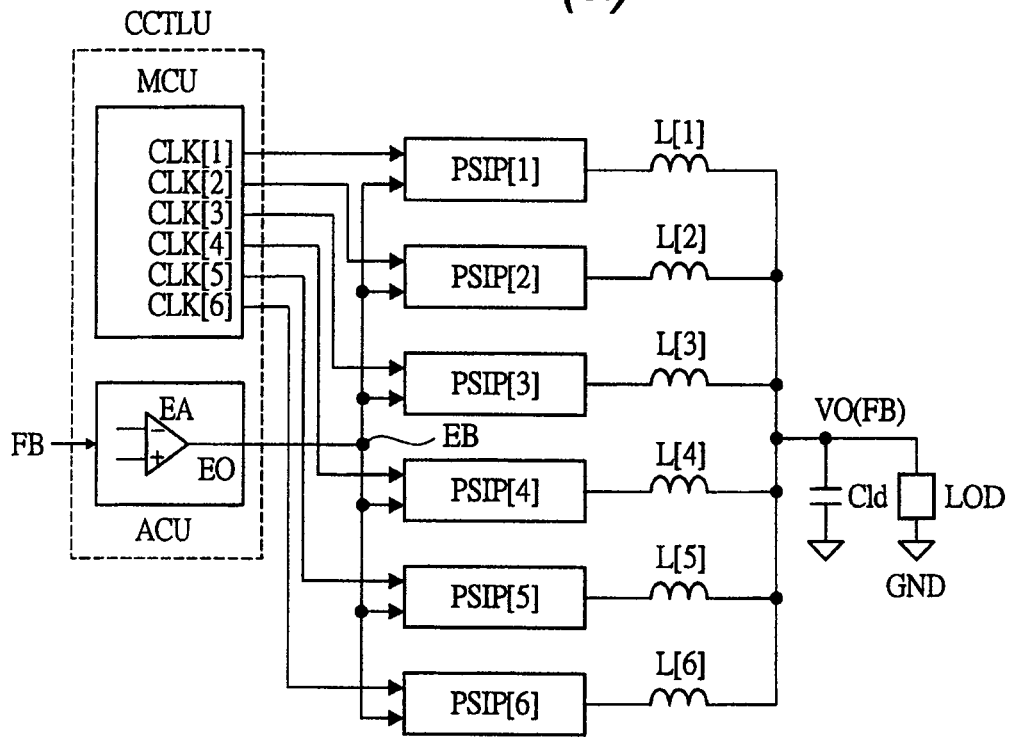

Whenever circumstances require it for convenience in the following embodiments, the subject matter will be described by being divided into a plurality of sections or embodiments. However, unless otherwise specified in particular, they are not irrelevant to one another. One thereof has to do with modifications, details, supplementary explanations and the like of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Circuit elements that configure respective functional blocks of the embodiments are not limited in particular, but formed over a semiconductor substrate like monocrystalline silicon by an IC technology of CMOS (complementary MOS transistors) or the like. Incidentally, when the circuit elements are described as MOSFETs (Metal Oxide Semiconductor Field Effect Transistors) (or abbreviated as MOS transistors), a non-oxide film will not be excluded as a gate insulating film.

Preferred embodiments of the present invention will hereinafter be described in detail based on the accompanying drawings. The same reference numerals are respectively attached to the same components or members in all the drawings for describing the embodiments in principle, and their repetitive description will be omitted.

First Embodiment

Figure 1B:
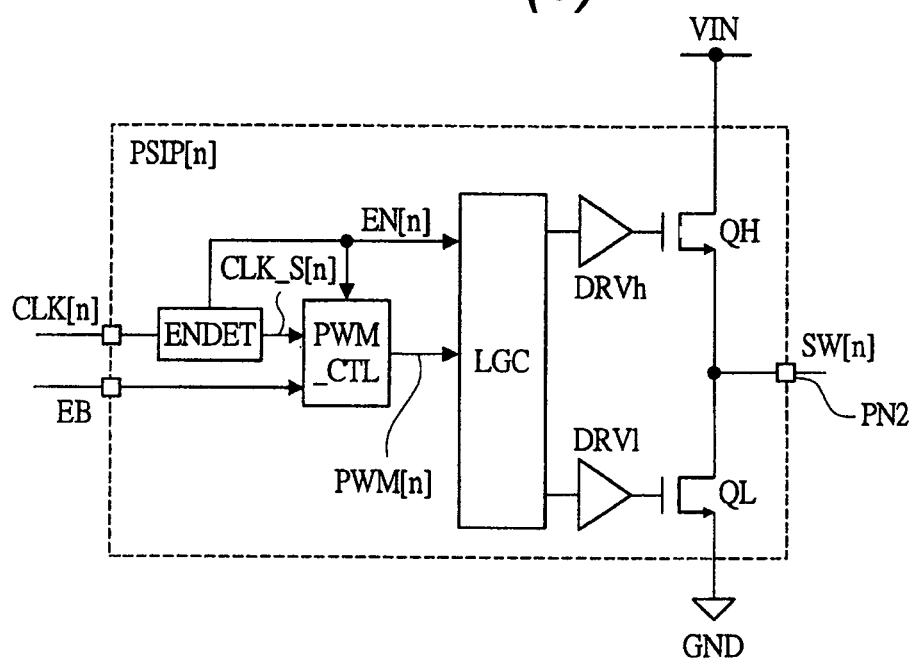

FIGS. 1(a) and 1(b) show a power supply device according to a first embodiment of the present invention, wherein FIG. 1(a) is a schematic diagram showing a configuration example thereof, and FIG. 1(b) is a schematic diagram showing an internal configuration example of a PWM-equipped drive unit PSIP [n] in FIG. 1(a). The power supply device shown in FIG. 1(a) comprises a microcontroller unit MCU, an analog companion unit ACU, a plurality (six herein) of PWM-equipped drive units PSIP [1] through PSIP [6] each corresponding to a semiconductor device, and a plurality of inductors L [1] through L [6].

The PWM-equipped drive units PSIP [1] through PSIP [6] are implemented by discrete semiconductor packages, for example, respectively. The microcontroller unit MCU and the analog companion unit ACU may also be implemented by discrete semiconductor packages respectively or implemented by one semiconductor package as a common control unit CCTLU. When the microcontroller unit MCU and the analog companion unit ACU are realized by one semiconductor package, they may also be formed by discrete semiconductor chips and thereafter mounted in one semiconductor package by a so-called SiP (System in Package) technology or may also be formed by one semiconductor chip to bring it into a package. These semiconductor packages are mounted over a printed circuit board (PCB) such as a motherboard, various extension boards (graphic board, etc.) in the vicinity of various circuit units (such as a CPU, a GPU, a memory, etc.) each of which serves as a load LOD.

The microcontroller unit MCU outputs clock signals CLK [n] to the PWM-equipped drive units PSIP [n] (where n=1 to 6). Here, the clock signals CLK [n] and CLK [n+1] are different from each other in phase by 60°. The analog companion unit ACU is equipped with an error amplifier EA, which outputs an error amplifier signal EO common to the respective PWM-equipped drive units PSIP [n] through an error bus EB. As shown in FIG. 1(b), each PSIP [n] comprises an enable detector ENDET, a PWM controller PWM_CTL, control logic LGC, drivers DRVh and DRVl, and transistors (power transistors) QH and QL.

The transistors QH and QL respectively correspond to a high side transistor and a low side transistor of a DC/DC converter. N channel MOSFETs (power MOSFETs) are used therefor herein. The transistor QH has a drain coupled to an input power supply voltage VIN (e.g., 12V or the like), a gate coupled to the driver DRVh, and a source coupled to an external terminal (output terminal) PN2 which serves as a terminal used to generate a switch signal SW[n], respectively. The transistor QL has a drain coupled to the external terminal PN2 (SW[n]), a gate coupled to the driver DRVl, and a source coupled to a ground power supply voltage GND, respectively. Here, the transistor coupled to the high voltage power supply side is defined as a high side transistor, whereas the transistor coupled to the low voltage power supply side is defined as a low side transistor. Although described later in detail, each enable detector ENDET receives the clock signal CLK[n] from the microcontroller unit MCU, generates an enable signal EN[n] according to the state of the clock signal CLK[n] and generates an internal clock signal CLK_S[n]. Each PWM controller PWM_CTL generates a PWM signal PWM[n] in accordance with a peak current control system using an internal clock signal CLK_S[n], an error amplifier signal EO and a current signal detected inside itself. The control logic LGC drives the transistor QH through the driver DRVh using the PWM signal PWM[n] and drives the transistor QL through the driver DRVl in accordance with a complementary signal of the PWM signal PWM[n].

Here, the PWM controller PWM_CTL supplies the PWM signal PWM[n] to the control logic LGC when the enable signal EN[n] is in an active state, and stops the supply of the PWM signal PWM[n] thereto when the enable signal EN[n] is in an inactive state. The control logic LGC supplies a switching signal corresponding to the PWM signal PWM[n] to each of the transistors QH and QL when the enable signal EN[n] is in the active state, and controls both transistors QH and QL to off when the enable signal EN[n] is in the inactive state. Further, each of the PWM controller PWM_CTL and the control logic LGC is more desirably provided with the function of transitioning itself to a power saving mode when the enable signal EN[n] is in the inactive state. Described concretely, there are mentioned, for example, the function of stopping part or all of a bias current supplied to its own internal circuit to thereby operate only the required minimum circuit, etc.

Each inductor L[n] has one end coupled commonly to an output power supply node VO and the other end coupled to the external terminal (output terminal) PN2 (SW[n]). Thus, the respective PWM-equipped drive units PSIP[n] supply energy to their own corresponding inductors L[n] in phases respectively different from one another in accordance with the PWM signals PWM[n] and generate a predetermined power supply (e.g., a voltage of 1V) at the output power supply node VO through PWM operations of six phases in maximum, associated with the supply of the energy. A load LOD, which serves as various circuit units (such as a CPU, a GPU, a memory, etc.), is coupled to the output power supply node VO. The load LOD operates with the output power supply node VO as a power supply. A voltage at the output power supply node VO is fed back to the analog companion unit ACU as an output voltage detection signal FB, which is reflected in the error amplifier signal EO through the error amplifier EA.

Figure 2A:
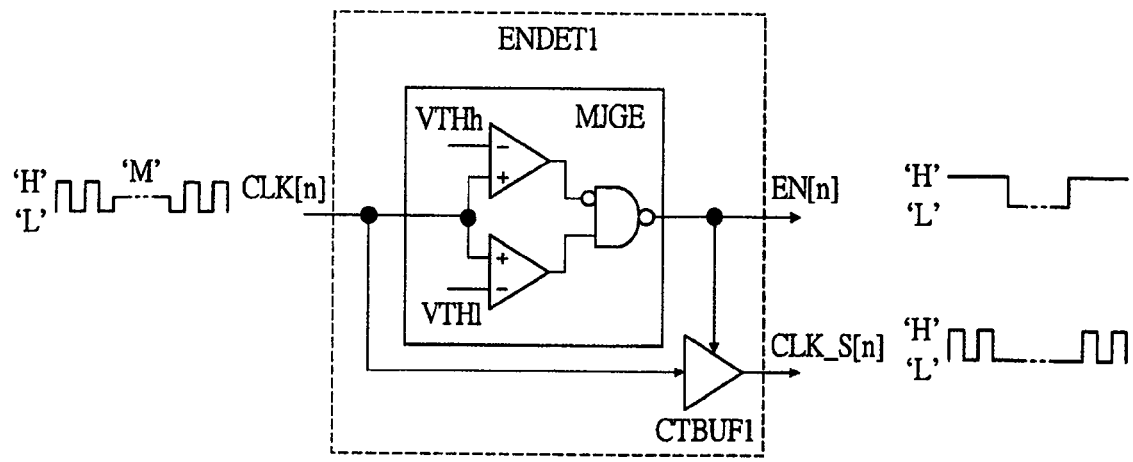
FIGS. 2(a) and 2(b) are respectively diagrams showing respective different configuration examples of enable detectors shown in FIGS. 1(a) and 1(b)
Figure 2B:
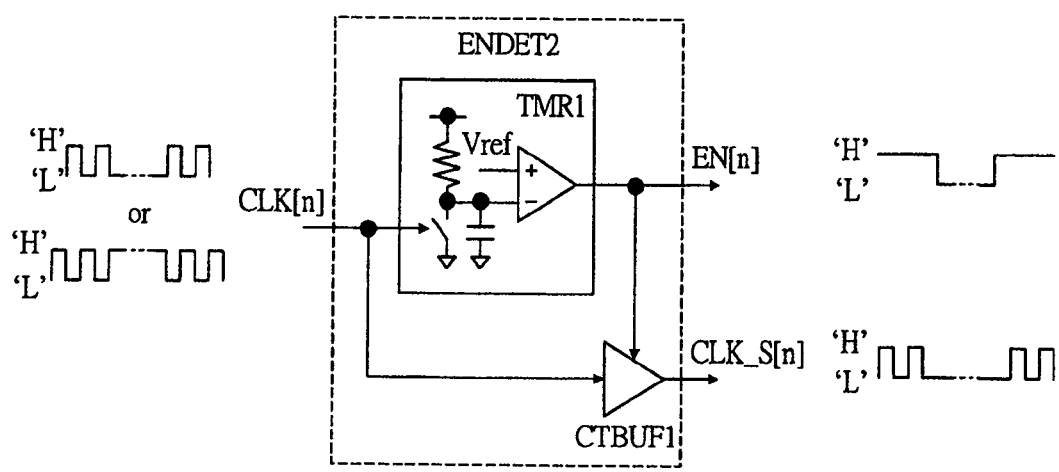

FIGS. 2(a) and 2(b) are conceptual diagrams showing respective different configuration examples of the enable detectors ENDET shown in FIGS. 1(a) and 1(b). The enable detector ENDET1 shown in FIG. 2(a) comprises a middle level (high impedance) detection circuit MJGE and a control buffer CTBUF1. The middle level detection circuit MJGE brings an enable signal EN[n] to an 'L' level (inactive state) when a voltage level of a clock signal CLK[n] lies between a low ('L') level decision voltage VTHl and a high ('H') level decision voltage VTHh, and brings the enable signal EN[n] to an 'H' level (active state) at other times. The middle level detection circuit MJGE can be implemented using, for example, two comparators or the like. The control buffer CTBUF1 outputs the clock signal CLK[n] as an internal clock signal CLK_S[n] when the enable signal EN[n] is at the 'H' level, and fixes the internal clock signal CLK_S[n] to the 'L' level (or 'H' level) when the enable signal EN[n] is at the 'L' level.

On the other hand, the enable detector ENDET2 shown in FIG. 2(b) comprises a timer TMR1 and a control buffer CTBUF1. The timer TMR1 sets the enable signal EN[n] to the 'L' level (inactive state) when, for example, the clock signal CLK[n] is at the 'H' or 'L' level continuously during a predetermined period (>the period of clock signal CLK[n]), and sets the enable signal EN[n] to the 'H' level (active state) at other times. The timer TMR1 can be implemented by, for example, an analog integration circuit and a comparator for determining its output voltage, or a counter or the like for digitally counting an 'H' or 'L' level period. The control buffer CTBUF1 outputs the clock signal CLK[n] as an internal clock signal CLK_S[n] when the enable signal EN[n] is at the 'H' level and fixes the internal clock signal CLK_S[n] to the 'L' level (or 'H' level) when the enable signal EN[n] is at the 'L' level. Incidentally, the configuration example of FIG. 2(a) is superior over the configuration example of FIG. 2(b) in that there is no need to provide a relatively long-period integration circuit or an oscillator circuit or the like for a counter.

The provision of such enable detectors ENDET enables the sharing of the single clock signal CLK[n] for the supply of clock signals for every phase and the supply of enable signals for every phase in FIGS. 1(a) and 1(b). Consider, as an example, where the enable detector ENDET1 shown in FIG. 2(a) is used, for example. When the microcontroller unit MCU of FIG. 1(a) outputs a middle level to the clock signals CLK[2], CLK[4] and CLK[6] during a certain period, enable signals EN[2], EN[4] and EN[6] are respectively brought to an inactive state by the enable detector ENDET1 during that period. In doing so, the corresponding PWM-equipped drive units PSIP[2], PSIP[4] and PSIP[6] respectively stop PWM switching operations and thereby the corresponding PWM-equipped drive units PSIP[1], PSIP[3] and PSIP[5] respectively perform PWM switching operations of three phases (0°, 120° and 240°). Setting the PWM-equipped drive units PSIP[2], PSIP[4] and PSIP[6] to a power saving mode during the three-phase operating period enables power consumption of the entire power supply device.

Figure 25A:
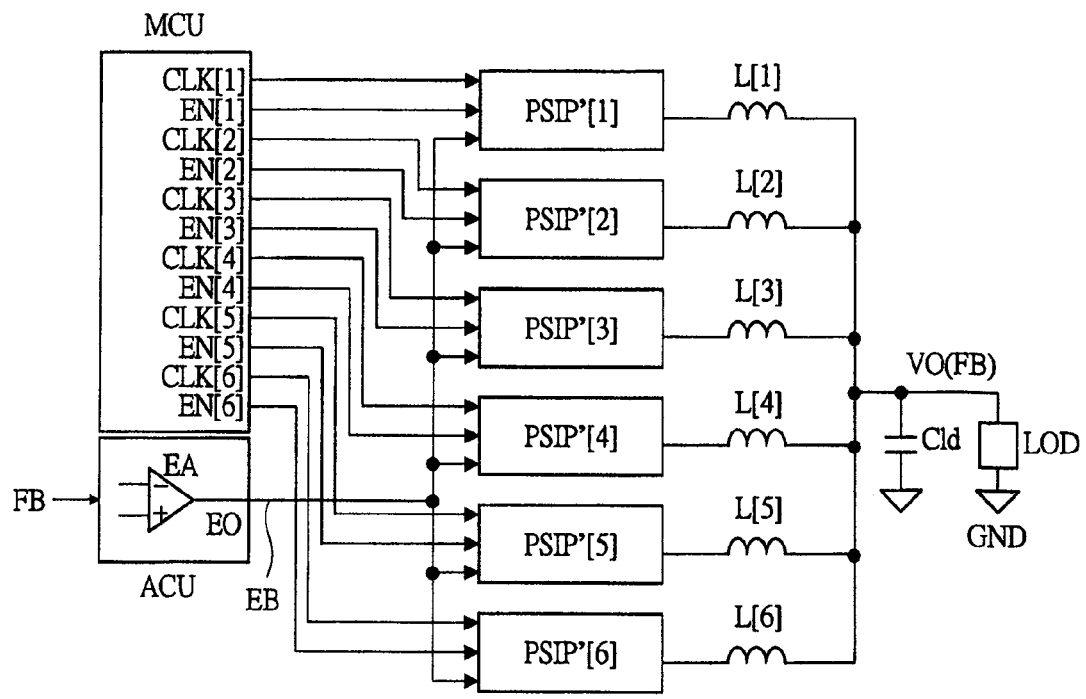
Figure 25B:
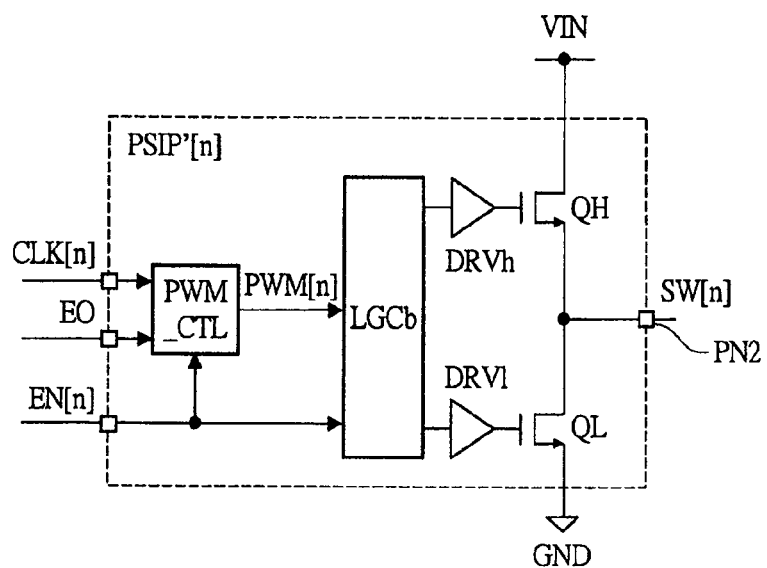

By using the power supply device shown in FIGS. 1(a) and 1(b) as described above, the number of wirings can further be reduced as compared with the above-described configuration example shown in FIGS. 25(a) and 25(b). That is, in the power supply device shown in FIGS. 1(a) and 1(b), one wiring (CLK[n]) may be provided per phase and one wiring (error bus EB) may be provided commonly between the respective phases in addition to it. For example, seven wirings are enough for the case of six phases (n=6), and nine wirings are enough for the case of eight phases (n=8). Accordingly, the layout on the printed circuit board (PCB) becomes easy from the following viewpoints, for example.

Firstly, the layout of wiring patterns becomes easy with the decrease in the number of wirings. Secondly, since the area of each power plane (e.g., the ground power supply voltage GND or the output power supply node VO, typically, Cu wiring) on the PCB can sufficiently be ensured, it is possible to reduce its resistance value and enhance power conversion efficiency. Since the area of each radiation pattern can also sufficiently be ensured, an increase in heat generated can be suppressed. Thirdly, it is possible to reduce the generation of noise such as wiring mutual crosstalk or the like on the PCB. Such advantageous effects make it possible to facilitate an increase in the number of phases and easily cope with an increase in the current on the load LOD, a reduction in the size of an electrical appliance, and so on. Further, since it is possible to reduce the number of pins for a package even from the viewpoint of device cost in addition to the viewpoint of such a mounting problem, a reduction in cost can be achieved.

Figure 3:
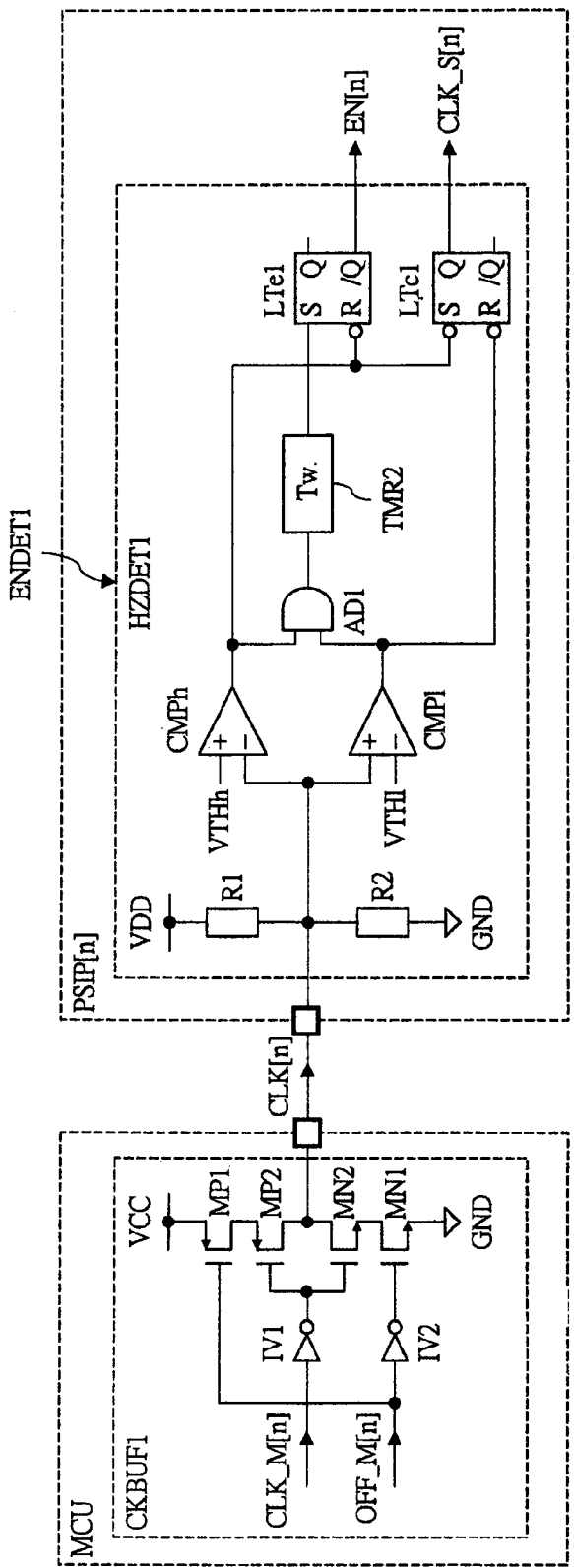
FIG. 3 is a circuit diagram showing a detailed configuration example of the enable detector shown in each of FIGS. 1(a) and 1(b)

FIG. 3 is a circuit diagram showing a detailed configuration example of the enable detector ENDET shown in each of FIGS. 1(a) and 1(b). A circuit example of a clock buffer CKBUF1 included in the microcontroller unit MCU, and a circuit example of a more embodied high impedance detector HZDET1 of the enable detector ENDET1 shown in FIG. 2(a), which is included in each PWM-equipped drive unit PSIP[n], are shown in FIG. 3. The clock buffer CKBUF1 of the microcontroller unit MCU serves as a so-called clocked inverter circuit comprising PMOS transistors MP1 and MP2, NMOS transistors MN1 and MN2, and inverters IV1 and IV2. The PMOS transistors MP1 and MP2 have source-drain paths coupled in series between a power supply voltage VCC (e.g., 5V) and an output node for the corresponding clock signal CLK[n]. The NMOS transistors MN1 and MN2 have source-drain paths coupled in series between a ground power supply voltage GND and the output node for the clock signal CLK[n].

A master clock signal CLK_M[n] and a master control signal OFF_M[n] are inputted to the clock buffer CKBUF1. The master clock signal CLK_M[n] is applied to gates of the transistors MP2 and MN2 via the inverter IV1, and the maser clock control signal OFF_M[n] is applied to a gate of the PMOS transistor MP1 and applied to a gate of the NMOS transistor MN1 via the inverter IV2. Accordingly, the clock signal CLK[n] obtained from the output node becomes a signal corresponding to the master clock signal CLK_M[n] when the master clock control signal OFF_M[n] is at an 'L' level. When the master clock control signal OFF_M[n] is at an 'H' level, the clock signal CLK[n] becomes a high impedance level. The frequency of the clock signal CLK[n] ranges from about 100 kHz to about 1 MHz, for example.

On the other hand, the high impedance detector HZDET1 in each PWM-equipped drive unit PSIP[n] comprises resistors R1 and R2, comparators CMPh and CMPl, an AND circuit AD1, a timer TMR2, and set/reset latches LTel and LTcl. The resistor R1 is provided between a node for the input of the clock signal CLK[n] from the microcontroller unit MCU and the power supply voltage VDD (e.g., 5V). The resistor R2 is provided between the input node and the ground power supply voltage GND. The resistors R1 and R2 are used to determine a voltage level when the clock signal CLK[n] is of high impedance. Although not limited in particular, R1=R2=100 kΩ or so. The resistance values of the resistors R1 and R2 may desirably be high to reduce power consumption. Further, they may desirably be R1=R2 to set the high impedance level to a value near ½·VDD in terms of an input margin. Although not limited in particular, the resistors R1 and R2 can be implemented by, for example, polysilicon or the like formed within a semiconductor chip.

The comparator CMPh has a (+) input node to which an 'H' level decision voltage VTHh (e.g., 4V) is applied, and a (−) input node to which the input node for the CLK[n] is coupled. The comparator CMPl has a (−) input node to which an 'L' level decision voltage VHTl (e.g., 1V) is applied, and a (+) input node to which the input node for the CLK[n] is coupled. The AND circuit AD1 performs an AND operation in response to the output of the comparator CMPh and the output of the CMPl. The timer TMR2 outputs an 'H' level where an 'H' level output from the AND circuit AD1 is continuous during a period Tw. The period Tw is 50 ns or so, for example, and corresponds to a period for discriminating that the output is reliably a high impedance level (e.g., 2.5V). That is, it shows a period during which a switching period (period for the transition from 'H' level to 'L' level or from 'L' level to 'H' level) of the clock signal CLK[n] at the normal operation is eliminated.

The set/reset latch LTel performs a set operation in response to the output of the 'H' level from the timer TMR2 and performs a reset operation in response to the output of the 'L' level from the comparator CMPh. The set/reset latch LTel outputs an 'L' level to the enable signal EN[n] when the set operation is carried out, and outputs an 'H' level to the enable signal EN[n] when the reset operation is done. On the other hand, the set/reset latch LTcl performs a set operation in response to the output of the 'L' level from the comparator CMPh and performs a reset operation in response to the output of the 'L' level from the comparator CMPl. The set/reset latch LTcl outputs an 'H' level to the internal clock signal CLK_S[n] where the set operation is performed, and outputs an 'L' level to the internal clock signal CLK_S[n] where the reset operation is performed.

Figure 4:
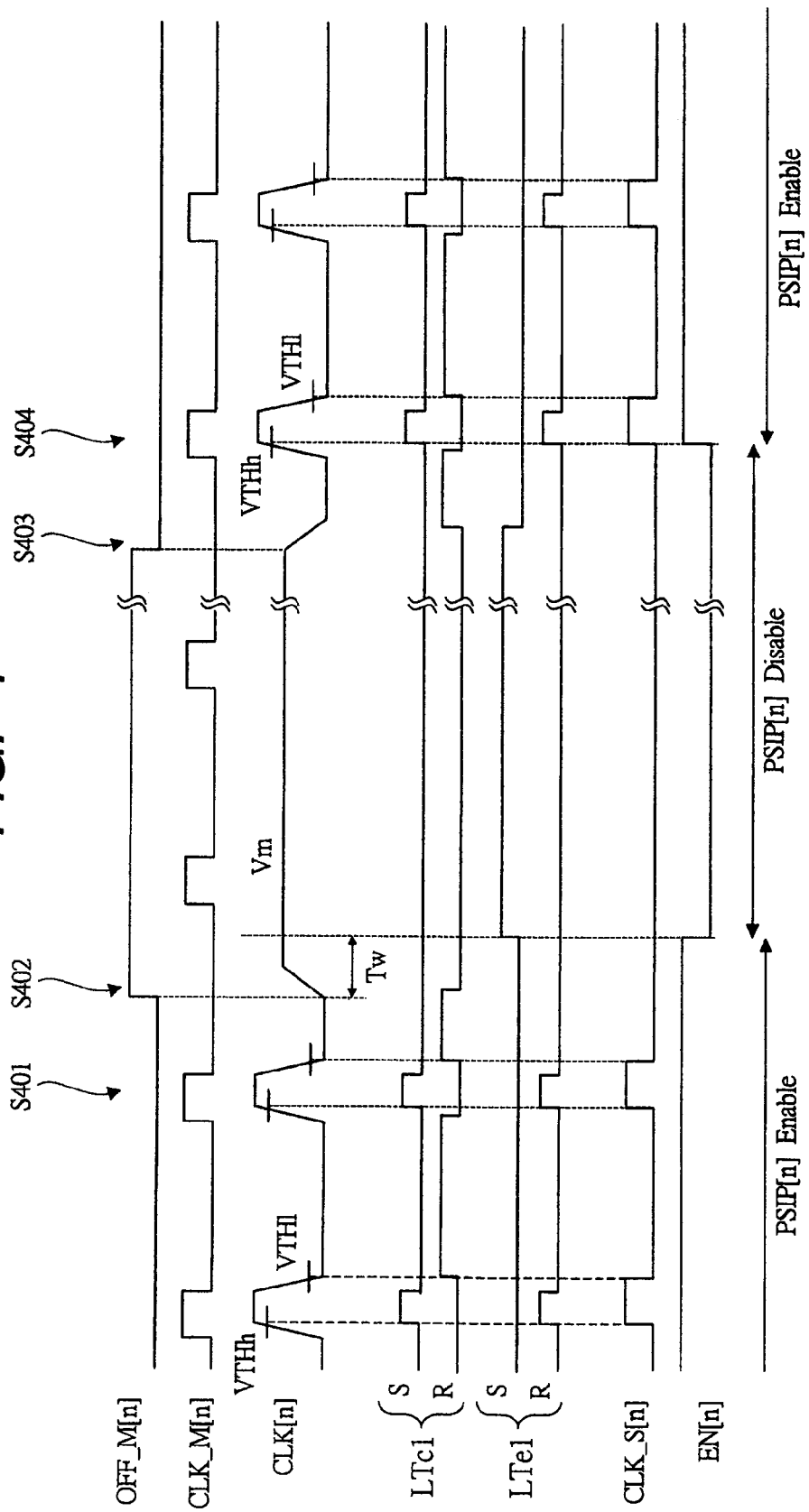
FIG. 4 is a waveform diagram showing an operational example of the high impedance detector shown in FIG. 3.

FIG. 4 is a waveform diagram showing an operational example of the high impedance detector HZDET1 shown in FIG. 3. In FIGS. 3 and 4, a period during which a set input (S) of the set/reset latch LTcl becomes an 'H' level (/S: 'L' level), corresponds to a period during which the voltage level of the clock signal CLK[n] exceeds the 'H' level decision voltage VTHh, whereas a period during which its reset input (R) becomes an 'H' level (/R: 'L' level), corresponds to a period during which the voltage level of the clock signal CLK[n] falls below the 'L' level decision voltage VTHl. A set input (S) of the set/reset latch LTel becomes an 'H' level for a period during which the voltage level of the clock signal CLK[n] is at a middle level and is continuous during a predetermined period (Tw). A period during which its reset input (R) becomes an 'H' level (/R: 'L' level), corresponds to a period during which the voltage level of the clock signal CLK[n] exceeds the 'H' level decision voltage VTHh Thus, when the clock signal CLK[n] corresponding to the master clock signal CLK_M[n] is inputted for the period during which the master clock control signal OFF_M[n] is of the 'L' level as designated at S401 in FIG. 4, an 'H' level is outputted from the comparator CMPl where the voltage level of the clock signal CLK[n] exceeds the 'L' level decision voltage VTHl with the transition of the clock signal CLK[n] to the 'H' level. In response to it, the reset input of the set/reset latch LTcl is retuned to the 'L' level. Further, when the voltage level of the clock signal CLK[n] exceeds the 'H' level decision voltage VTHh, an 'L' level is outputted from the comparator CMPh. In response to it, the set/reset latch LTcl performs a set operation and the set/reset latch LTel performs a reset operation. Thereafter, when the voltage level thereof falls below the 'H' level decision voltage VTHh with the transition of the clock signal CLK[n] to the 'L' level, an 'H' level is outputted from the comparator CMPh, and the set input of the set/reset latch LTcl is returned to the 'L' level in response to it. Furthermore, when the voltage level of the clock signal CLK[n] falls below the 'L' level decision voltage VTHl, an 'L' level is outputted from the comparator CMPl, and the set/reset latch LTcl performs a reset operation in response to it. Thus, a clock pulse is outputted to the internal clock signal CLK_S[n], and an 'H' level is outputted to the enable signal EN[n] ('H' level is maintained).

Next, when the master clock control signal OFF_M[n] is transitioned to an 'H' level and a high impedance level (middle level Vm) is inputted to the clock signal CLK[n] as designated at S402 of FIG. 4, an H' level is outputted from the comparator CMPl when the voltage level of the clock signal CLK[n] exceeds the 'L' level decision voltage VTHl with the transition of the clock signal CLK[n] to the middle level Vm, so that the reset input of the set/reset latch LTcl is returned to the 'L' level. Since the comparator CMPh outputs the 'H' level unless the voltage level of the clock signal CLK[n] exceeds the 'H' level decision voltage VHTh, the set/reset latch LTel performs a set operation when the period Tw has elapsed from the transition to the 'H' level of the comparator CMPl via the AND circuit AD1 and the timer TMR2. Consequently, the enable signal EN[n] is transitioned to an 'L' level. The set/reset latch LTcl does not output the clock pulse with the output of the 'H' level of the comparator CMPh.

Subsequently, when the master clock control signal OFF_M[n] is transitioned to an 'L' level as designated at S403 of FIG. 4, an 'L' level is outputted from the comparator CMPl when the voltage level of the clock signal CLK[n] falls below the 'L' level decision voltage VTHl with the transition of the clock signal CLK[n] to the 'L' level. In response to it, the set/reset latch LTcl performs a reset operation (maintains a reset state), and the set input of the set/reset latch LTel is returned to the 'L' level via the AND circuit AD1 and the timer TMR2.

Thereafter, when the clock signal CLK[n] corresponding to the master clock signal CLK_M[n] is inputted for the period during which the master clock control signal OFF_M[n] is of an 'L' level as designated at S404 in FIG. 4, an 'H' level is outputted from the comparator CMPl where the voltage level of the clock signal CLK[n] exceeds the 'L' level decision voltage VTHl with the transition of the clock signal CLK[n] to the 'H' level. In response to it, the reset input of the set/reset latch LTcl is retuned to the 'L' level. Further, when the voltage level of the clock signal CLK[n] exceeds the 'H' level decision voltage VTHh, an 'L' level is outputted from the comparator CMPh. In response to it, the set/reset latch LTcl performs a set operation and the set/reset latch LTel performs a reset operation. Thereafter, an operation similar to that at S401 referred to above is performed with the transition of the clock signal LCK[n] to the 'L' level. Consequently, a clock pulse is outputted to the internal clock signal CLK_S[n], and the enable signal EN[n] is transitioned to an 'H' level with the reset operation of the set/reset latch LTel.

Using the high impedance detector HZDET1 of FIG. 3 in this way makes it possible to generate the enable signal EN[n] through the use of the high impedance state of the clock signal CLK[n]. By fixing the internal clock signal CLK_S[n] to the 'L' level (or 'H' level) while the enable signal EN[n] is at the 'L' level as shown in FIG. 4, the PWM controller PWM_CTL shown in FIG. 1(b) does not cause signal transition in its internal circuit and provides a power saving. Incidentally, the circuit example shown in FIG. 3 is not, of course, limited to it, but may be modified in various ways. For instance, the comparators CMPh and CMPl may be replaced with inverters suitably adjusted in threshold voltage. Further, the set/reset latches LTel and LTcl may be modified as appropriate inclusive of their input/output polarities and the type of latch.

Using the power supply device according to the first embodiment as described above typically enables implementation of miniaturization of a power supply device using a multiphase system with a reduction in the number of wirings.

Second Embodiment

Figure 5:
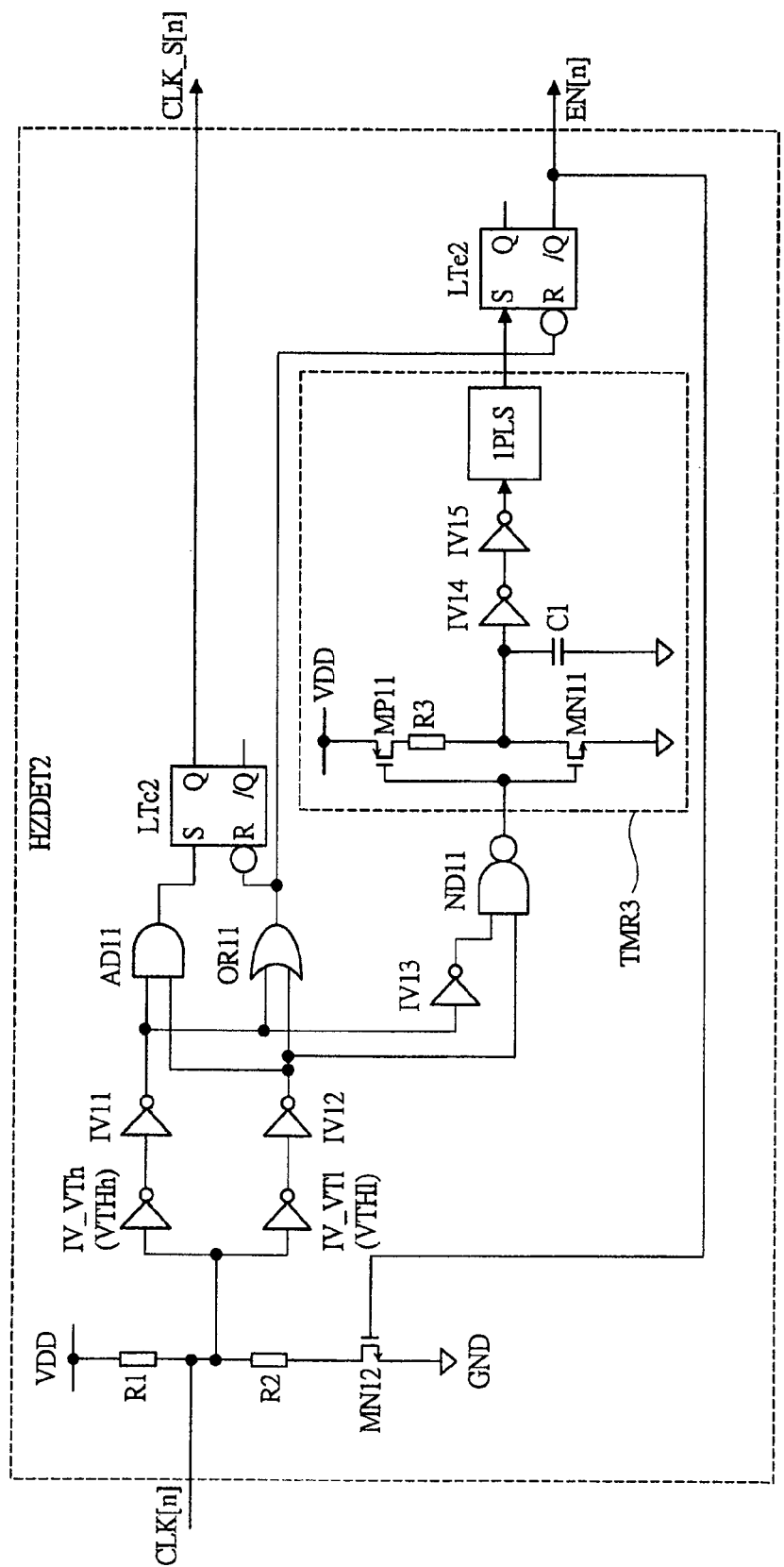
FIG. 5 is a circuit diagram illustrating a configuration example of an enable detector (high impedance detector) included in a power supply device according to a second embodiment of the present invention.

A second embodiment will explain a modification of the high impedance detector HZDET1 shown in FIG. 3. FIG. 5 is a circuit diagram showing a configuration example of an enable detector (high impedance detector) included in a power supply device according to the second embodiment of the present invention. The high impedance detector HZDET2 shown in FIG. 5 comprises resistors R1 and R2, threshold set inverters IV_VTh and IV_VTl, inverters IV11 through IV13, an AND circuit AD11, an OR circuit OR11, a NAND circuit ND11, a timer TMR3, set/reset latches LTe2 and LTc2, and an NMOS transistor MN12.

The resistor R1 is provided between a node for the input of a clock signal CLK[n] from a microcontroller unit MCU and a power supply voltage VDD (e.g., 5V). The resistor R2 has one end coupled to the input node of the clock signal CLK[n], and the other end coupled to a drain of the NMOS transistor MN12. The NMOS transistor MN12 has a source coupled to a ground power supply voltage GND and a gate controlled by an enable signal EN[n]. The threshold set inverter IV_VTh has a threshold value of the 'H' level decision voltage VTHh shown in FIG. 3 and performs an inverse operation in response to the clock signal CLK[n]. The threshold set inverter IV_VTl has a threshold value of the 'L' level decision voltage VTHl shown in FIG. 3 and performs an inverse operation in response to the clock signal CLK[n].

Both the AND circuit AD11 and the OR circuit OR11 respectively have one of two inputs to which an output of the threshold set inverter IV_VTh is inputted via the inverter IV11, and the other thereof to which an output of the threshold set inverter IV_VTl is inputted via the inverter IV12. The NAND circuit ND11 has one of two inputs to which the output of the threshold set inverter IV_VTh is inputted via the inverter IV11 and the inverter IV13, and the other thereof to which the output of the threshold set inverter IV_VTl is inputted via the inverter IV12.

The timer TMR3 comprises a PMOS transistor MP11, an NMOS transistor MN11, a resistor R3, inverters INV14 and IV15, a capacitor C1, and a one-shot pulse circuit (1PLS). The PMOS transistor MP11 has a source coupled to the power supply voltage VDD, a gate coupled to the output of the NAND circuit ND11, and a drain coupled to one end of the resistor R3, respectively. The NMOS transistor MN11 has a source coupled to the ground power supply voltage GND, a gate coupled to the output of the NAND circuit ND11, and a drain coupled to the other end of the resistor R3, respectively. The capacitor C1 is coupled between the other end of the resistor R3 and the ground power supply voltage GND. A signal obtained from the other end of the resistor R3 is inputted to the one-shot pulse circuit 1PLS via the inverters IV14 and IV15. The one-shot pulse circuit 1PLS outputs once an 'H' pulse having a pulse width of a predetermined time (e.g., 20 ns) when it detects the rising edge at the output of the IV15.

Although not limited in particular herein, the resistor R3 is 75 kΩ and the capacitor C1 is 2 pF, for example. In this case, the voltage of an input node of the inverter IV14 gradually rises to the power supply voltage VDD by a time constant of R3×C1 (150 ns herein) while the output of the ND11 is being maintained at an 'L" level. When the voltage reaches the threshold voltage of the inverter IV14, a rising edge occurs at an output node of the inverter IV15. Incidentally, since the output of the NAND ND11 becomes the 'L' level where the voltage level of the clock signal CLK[n] becomes a middle level larger than the 'L' level decision voltage VTHl and smaller than the 'H' level decision voltage VTHh, the timer TMR3 outputs a one-shot 'H' pulse only when the middle level is continuous during a certain degree of period.

The set/reset latch LTc2 performs a set operation in response to an 'H' level output from the AND circuit AD11 and performs a reset operation in response to an 'L' level output from the OR circuit OR11. The set/reset latch LTc2 outputs an 'H' level to an internal clock signal CLK_S[n] when it has performed the set operation, and outputs an 'L' level to the internal clock signal CLK_S[n] when it has performed the reset operation. On the other hand, the set/reset latch circuit LTe2 performs a set operation in response to an 'H' level output from the timer TMR3 and performs a reset operation in response to the 'L' level output from the OR circuit OR11. The set/reset latch LTe2 outputs an 'L' level to the enable signal EN[n] when it has performed the set operation, and outputs an 'H' level to the enable signal EN[n] when it has performed the reset operation.

Figure 6:
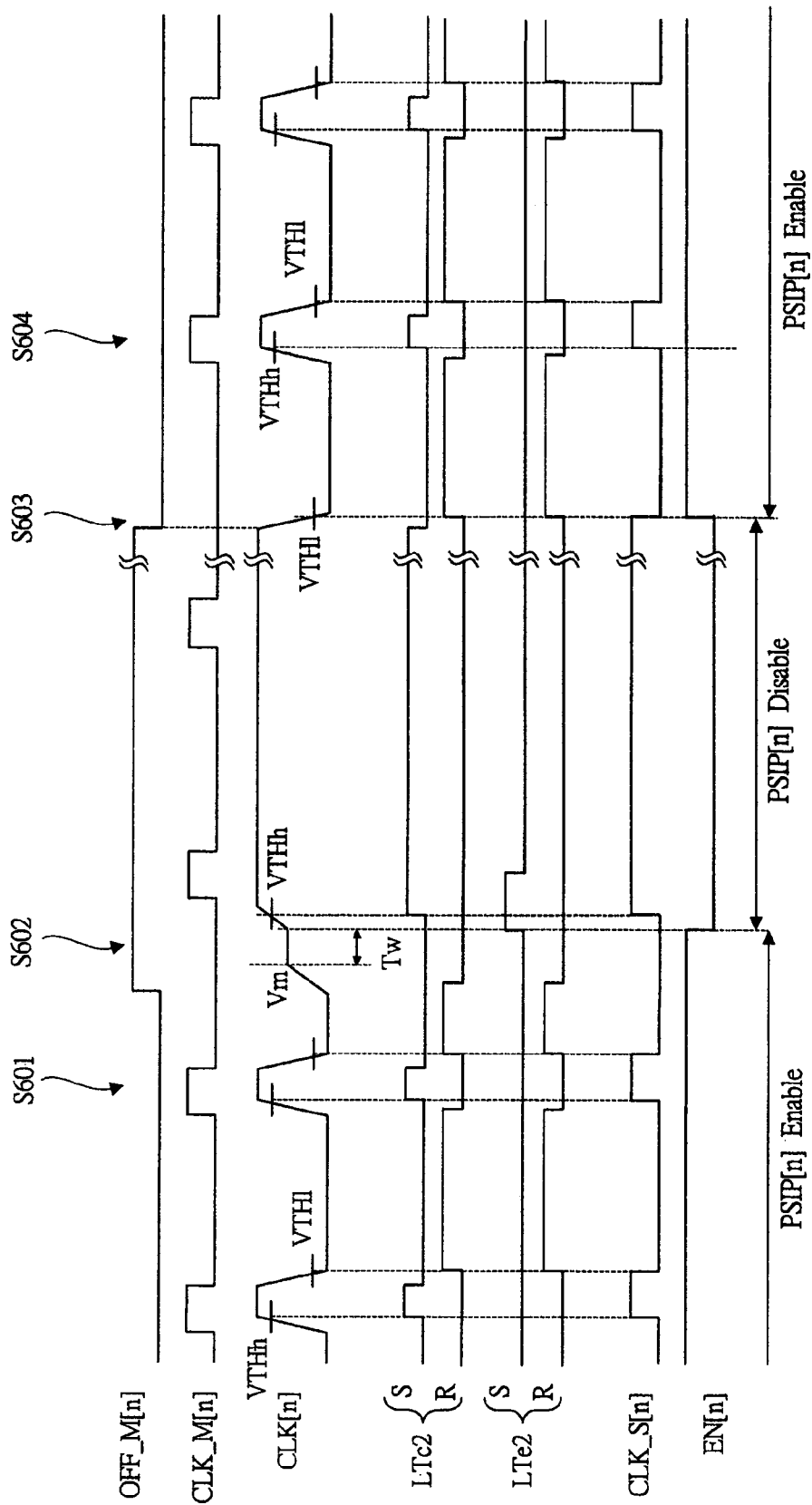
FIG. 6 is a waveform diagram showing an operational example of the high impedance detector shown in FIG. 5.

FIG. 6 is a waveform diagram showing an operational example of the high impedance detector HZDET2 shown in FIG. 5. Firstly, in FIG. 5, a period during which a set input (S) of the set/reset latch LTc2 becomes an 'H' level, corresponds to a period during which the voltage level of the clock signal CLK[n] exceeds the 'H' level decision voltage VTHh, whereas a period during which its reset input (R) becomes an 'H' level (/R: 'L' level), corresponds to a period during which the voltage level of the clock signal CLK[n] falls below the 'L' level decision voltage VTHl. A period during which a set input (S) of the set/reset latch LTe2 becomes an 'H' level, corresponds to a one-shot pulse period during which the voltage level of the clock signal CLK[n] is at a middle level and which is taken after it has continued for a predetermined period. A period during which its reset input (R) becomes an 'H' level (/R: 'L' level), corresponds to a period during which the voltage level of the clock signal CLK[n] falls below the 'L' level decision voltage VTHl.

Thus, when the clock signal CLK[n] corresponding to a master clock signal CLK_M[n] is inputted for a period during which a master clock control signal OFF_M[n] is of an 'L' level as designated at S601 in FIG. 6, the reset inputs of the set/reset latches LTc2 and LTe2 are respectively returned to the 'L' level where the voltage level of the clock signal CLK [n] exceeds the 'L' level decision voltage VTHl with the transition of the clock signal CLK[n] to the 'H' level. Further, the set/reset latch LTc2 performs a set operation when the voltage level of the clock signal CLK[n] exceeds the 'H' level decision voltage VTHh. Thereafter, when the voltage level thereof falls below the 'H' level decision voltage VTHh with the transition of the clock signal CLK[n] to the 'L' level, the set input of the set/reset latch LTc2 is returned to the 'L' level. Further, when the voltage level of the clock signal CLK[n] falls below the 'L' level decision voltage VTHl, the LTc2 and LTe2 respectively perform a reset operation. Thus, a clock pulse is outputted to the internal clock signal CLK_S[n], and an 'H' level is outputted to the enable signal EN[n] ('H' level is maintained).

Next, when the master clock control signal OFF_M[n] is transitioned to an 'H' level and a high impedance level (middle level Vm) is inputted to the clock signal CLK[n] as designated at S602 of FIG. 6, the reset inputs of the set/reset latches LTc2 and LTe2 are returned to the 'L' level where the voltage level of the clock signal CLK[n] exceeds the 'L' level decision voltage VTHl with the transition of the clock signal CLK[n] to the middle level Vm. Since the NAND circuit ND11 outputs the 'L' level unless the voltage level of the clock signal CLK[n] is at the middle level that does not exceed the 'H' level decision voltage VHTh, a one-shot pulse is outputted from the timer TMR3 where the middle level is continuous during the predetermined period (Tw) corresponding to the above C1×R3, so that the set/reset latch LTe2 performs a set operation in response to the one-shot pulse. When this set operation is performed, the enable signal EN[n] is transitioned to the 'L' level and the NMOS transistor MN12 is driven to off in response to it. Consequently, the current passing through the resistors R1 and R2 is cut off.

On the other hand, when the NMOS transistor MN12 is driven to off, the input node of the clock signal CLK[n] rises to the 'H' level. When the voltage of the clock signal CLK[n] exceeds the 'H' level decision voltage VTHh with its rise, the LTc2 performs a set operation so that the internal clock signal CLK_S[n] is transitioned to an 'H' level. Subsequently, the internal clock signal CLK_S[n] is fixed to the 'H' level unless the clock signal CLK[n] is transitioned to the 'L' level. Thereafter, when the master clock control signal OFF_M[n] is in an 'L' level state and the master clock control signal OFF_M[n] is transitioned to the 'L' level, as designated at S603 of FIG. 6, the voltage level of the CLK[n] is also reduced to the 'L' level correspondingly. When the voltage level of the clock signal CLK[n] falls below the 'H' level decision voltage VTHh with the transition of the CLK[n] to the 'L' level, the set input of the set/reset latch LTc2 is returned to the 'L' level. Further, when the voltage level thereof falls below the 'L' level decision voltage VTHl, the set/reset latches LTc2 and LTe2 respectively perform a reset operation. Consequently, the internal clock signal CLK_S[n] is transitioned to the 'L' level and the enable signal EN[n] is transitioned to the 'H' level. When the enable signal EN[n] is transitioned to the 'H' level, the NMOS transistor MN12 is turned on again. Thereafter, an operation similar to that at S601 is performed at S604 of FIG. 6.

Thus, the high impedance detector HZDET2 shown in FIG. 5 is principally different in the following points as compared with the high impedance detector HZDET1 of FIG. 3. The first principal point of difference resides in that the comparators CMPh and CMPl shown in FIG. 3 are changed to the threshold set inverters IV_VTh and IV_VTl. It is thus possible to reduce a circuit area. The second principal point of difference resides in that the NMOS transistor MN12 for cutting-off of steady or stationary current is additionally provided. It is thus possible to reduce current consumption where the enable signal EN[n] is in the inactive state ('L' level).

Using the power supply device according to the second embodiment as described above typically enables implementation of a size reduction in a power supply device using a multiphase system with a reduction in the number of wirings in a manner similar to the first embodiment. It is further possible to realize a further reduction in power consumption of the power supply device as compared with the first embodiment. Incidentally, the configuration example of FIG. 5 is not, of course, limited to it, but may be modified as appropriate. For instance, a PMOS transistor, which serves as a current cut-off switch, may be provided on the VDD side instead of the provision of the NMOS transistor MN12 serving as the current-cutoff switch on the GND side as shown in FIG. 5.

Third Embodiment

Figure 7:
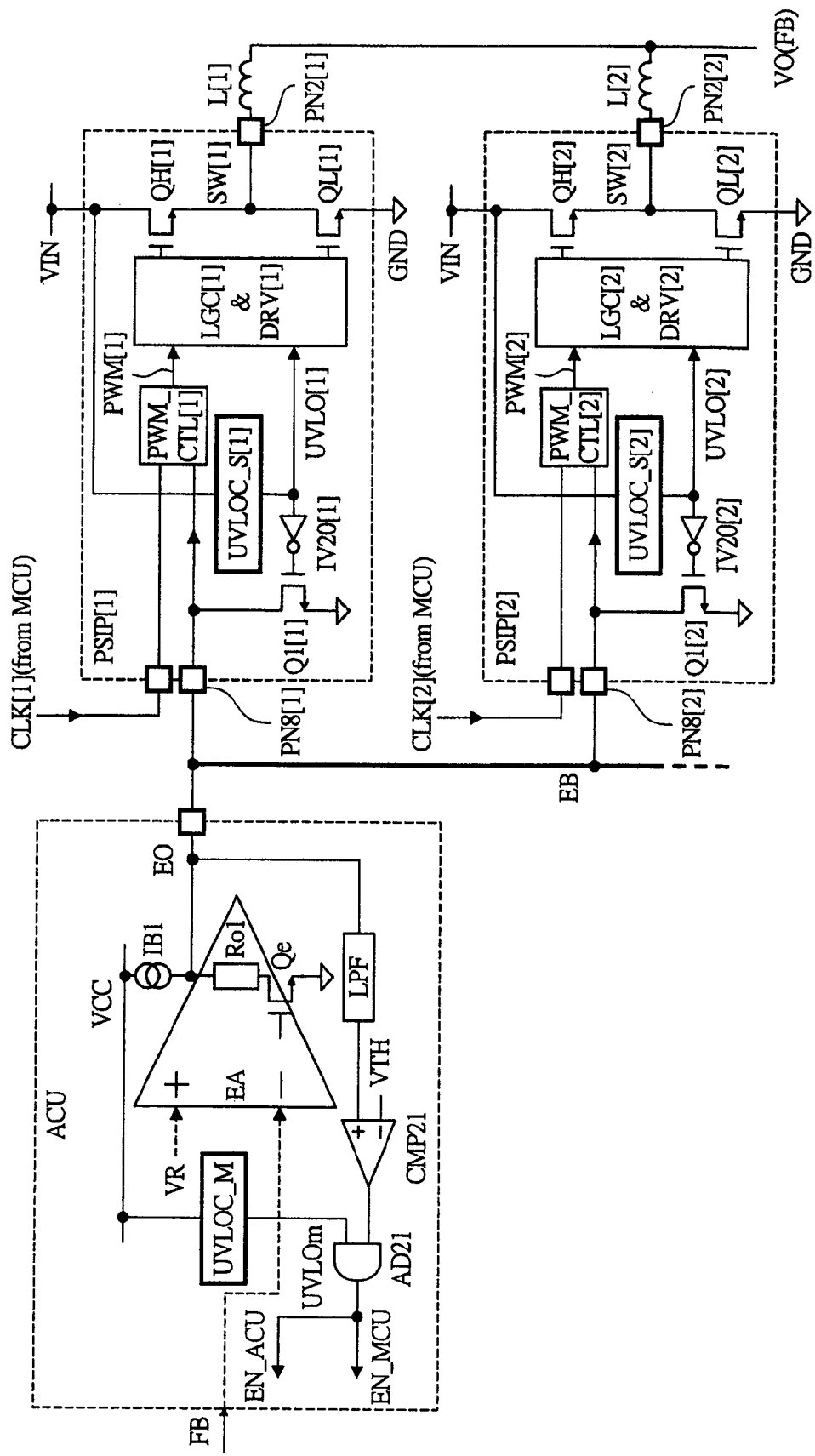
FIG. 7 is a schematic diagram illustrating one example of a configuration of a power supply device according to a third embodiment of the present invention.

FIG. 7 is a schematic diagram illustrating one example of a configuration of a power supply device according to a third embodiment of the present invention. A configuration example related to the error bus EB shown in FIGS. 1(*a*) and 1(*b*) is illustrated in FIG. 7. The power supply device shown in FIG. 7 comprises an analog companion unit ACU, a plurality (two herein) of PWM-equipped drive units PSIP[1] and PSIP[2], and inductors L[1] and L[2].

The analog companion unit ACU comprises an error amplifier EA, a low-pass filter LPF, a comparator CMP21, an AND circuit AD21, and an input voltage detection circuit UVLOC_M. The error amplifier EA includes, as its equivalent circuit, a bias current source IB1 whose one end is coupled to a power supply voltage VCC, and a voltage value adjusting resistor Ro1 provided between the other end of the bias current source IB1 and a drain of an input transistor Qe whose source is coupled to a ground power supply voltage GND, in addition to the input transistor Qe. The error amplifier EA generates an error amplifier signal EO from a coupling node of the bias current source IB1 and the voltage value adjusting resistor Ro1 and outputs it to the error bus EB. Incidentally, although the equivalent circuit is shown herein, an actual circuit is of a differential amplifier circuit provided with a differential pair of transistors.

The low-pass filter LPF smoothes a voltage level on the error bus EB. The comparator CMP21 determines the voltage level on the error bus EB with the voltage level output from the low-pass filter LPF as a (+) input and a comparison voltage VTH as a (−) input. The input voltage detection circuit UVLOC_M outputs an 'H' level to an input voltage detection signal UVLOm when the power supply voltage VCC (e.g., 5V or the like) is higher than a predetermined voltage (e.g., 4V or the like). The AND circuit AD21 performs an AND operation with a result of comparison output from the comparator CMP21 and the input voltage detection signal UVLOm as inputs and controls an 'H' level (active state) and an 'L' level (inactive state) of an ACU enable signal EN_ACU and an MCU enable signal EN_MCU according to the result of its AND operation. Other internal circuits (not shown) in the analog companion unit ACU are made effective in operation in response to the 'H' level of the ACU enable signal EN_ACU. Incidentally, the MCU enable signal EN_MCU is outputted to the microcontroller unit MCU.

On the other hand, each individual PWM-equipped drive unit PSIP[n] (where n=1 and 2) comprises a PWM controller PWM_CTL[n], control logic LGC[n] and a driver DRV[n], transistors (power transistors) QH[n] and QL[n], an input voltage detection circuit UVLOC_S[n], an inverter IV20[n], and a transistor Q1[n]. The power transistors QH[n] and QL[n] make use of N channel MOSFETs (power MOSFETs) herein. The power transistor QH[n] has a drain coupled to an input power supply voltage VIN (e.g., 12V or the like), and a source coupled to an external terminal (output terminal) PN2[n] used as a terminal for generating a switch signal SW[n], respectively. The power transistor QL[n] has a drain coupled to the external terminal PN2[n] (SW[n]) and a source coupled to the ground power supply voltage GND, respectively. Gates of the power transistors QH[n] and QL[n] are controlled by the driver DRV[n].

The PWM controller PWM_CTL[n] generates a PWM signal PWM[n] by a peak current control system using a clock signal CLK[n] inputted from the microcontroller unit MCU, the error amplifier signal EO inputted from the analog companion unit ACU and a current signal detected inside itself. The control logic LGC[n] drives the power transistor QH[n] through the driver DRV[n] using the PWM signal PWM[n] and drives the power transistor QL[n] through the driver DRV[n] by a complementary signal of the PWM signal PWM[n].

The input voltage detection circuit UVLOC_S[n] outputs an 'H' level to the corresponding input voltage detection signal UVLO[n] when the input power supply voltage VIN (e.g., 12V or the like) is higher than a predetermined voltage (e.g., 8V or the like). The transistor Q1[n] is of, for example, an NMOS transistor, which has a drain coupled to an external terminal PN8[n] to which the error amplifier signal EO is inputted, and a source coupled to the ground power supply voltage GND. The inverter IV20[n] drives a gate of the transistor Q1[n] in accordance with an inverted signal of the input voltage detection signal UVLO[n] with the input voltage detection signal UVLO[n] as an input. The control logic LGC[n] drives both the power transistors QH[n] and QL[n] to off through the driver DRV[n] when the input voltage detection signal UVLO[n] is at an 'L' level.

Each inductor L[n] has one end coupled commonly to an output power supply node VO and the other end coupled to the external terminal PN2[n] (SW[n]). Thus, the respective PWM-equipped drive units PSIP[n] supply energy to their own corresponding inductors L[n] in phases respectively different from one another in accordance with the PWM signals PWM[n] and generate a predetermined power supply (e.g., a voltage of 1V) at the output power supply node VO by multiphase PWM operations associated with the supply of the energy. The voltage at the output power supply node VO is fed back to the analog companion unit ACU as an output voltage detection signal FB, which is reflected in the error amplifier signal EO through the error amplifier EA. The error amplifier EA compares a voltage VR for setting the voltage of the output power supply node VO and the output voltage detection signal FB. When the output voltage detection signal FB is lower than the set voltage VR, the error amplifier EA raises the voltage level of the error amplifier signal EO, and lowers the voltage level of the error amplifier signal EO when the output voltage detection signal FB is higher than the set voltage VR.

Figure 9A:
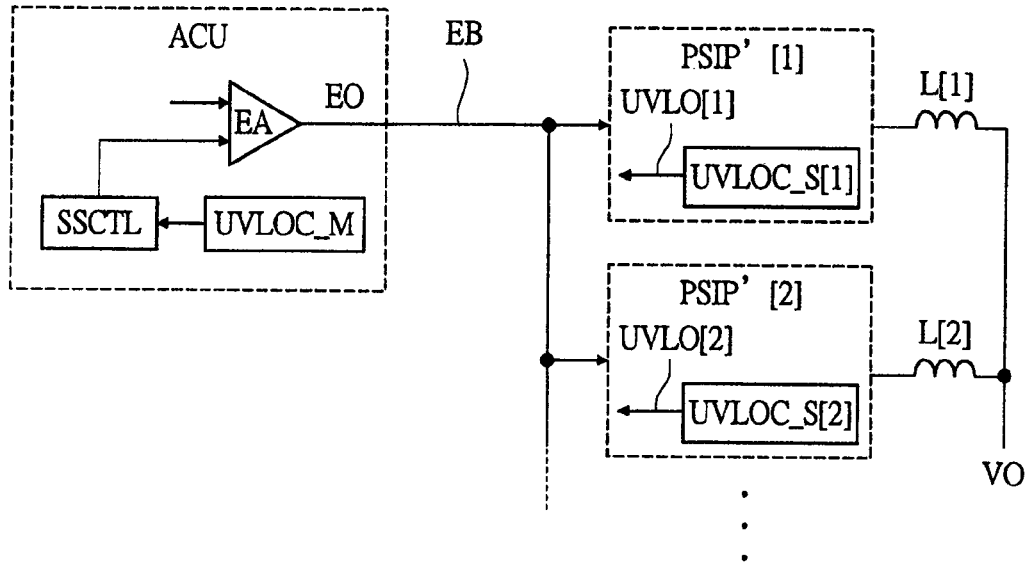
FIGS. 9(a) and 9(b) are diagrams showing configuration examples respectively different from each other, which have been discussed as the premise of FIG. 7.
Figure 9B:
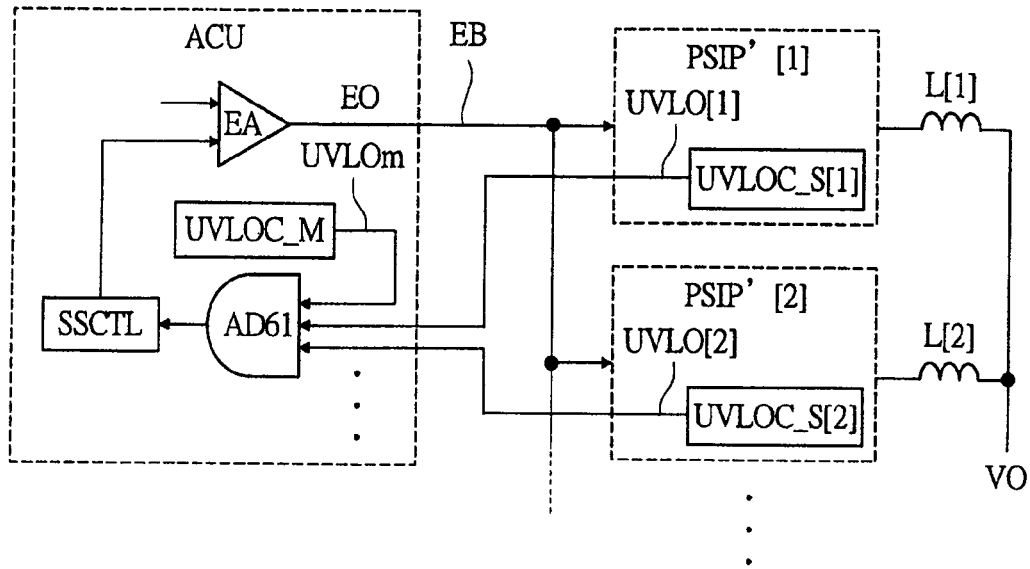
Figure 10:
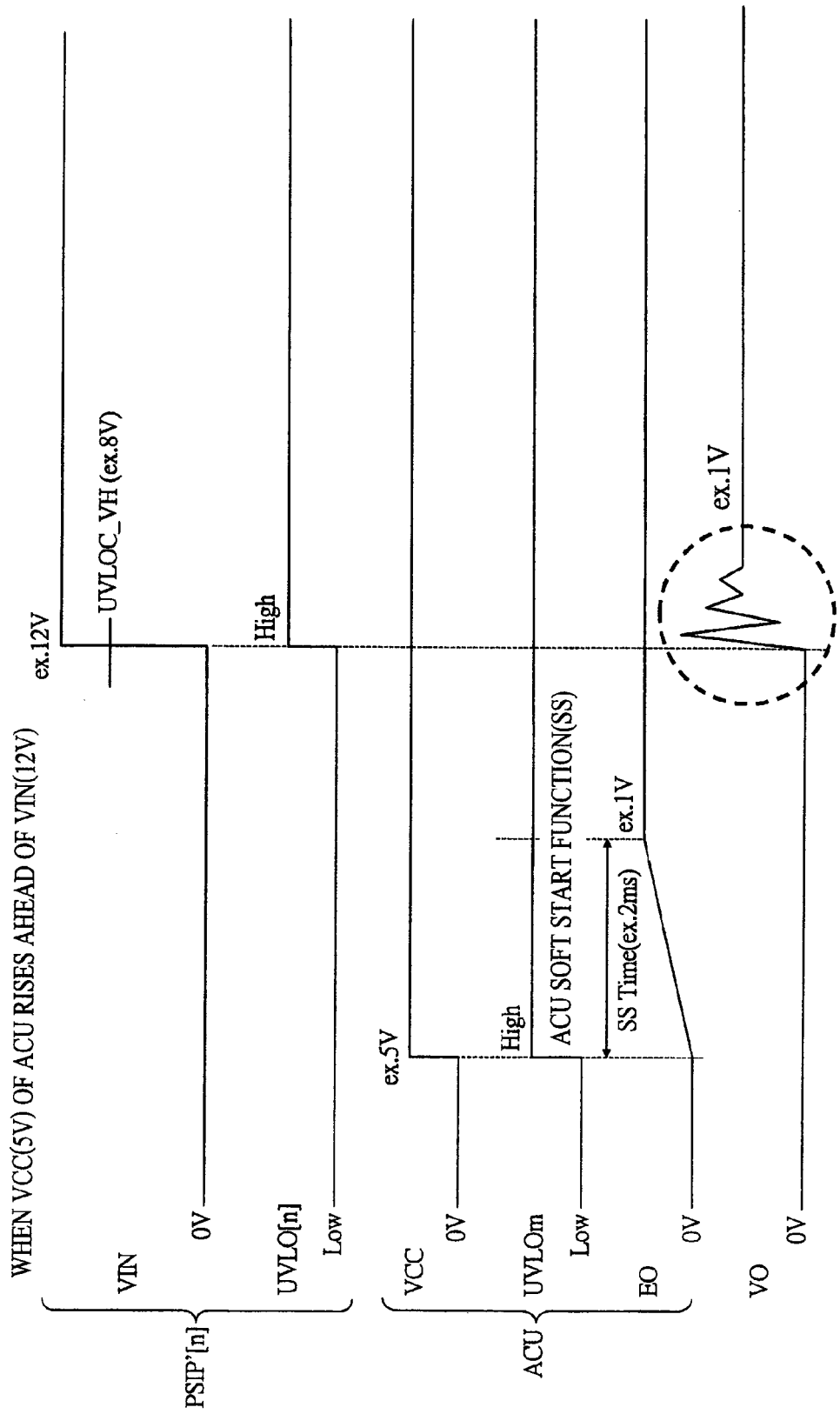
FIG. 10 is a diagram for explaining a first problem where the configuration example of FIG. 9(a) is used.
Figure 11A:
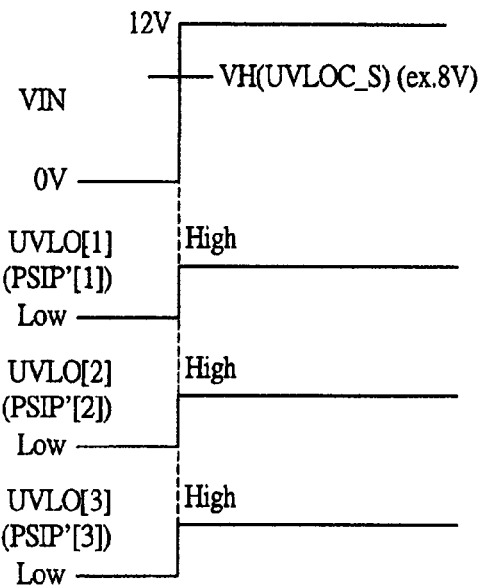
FIGS. 11(a) and 11(b) are diagrams for explaining a second problem where the configuration example of FIG. 9(a) is used.
Figure 11B:
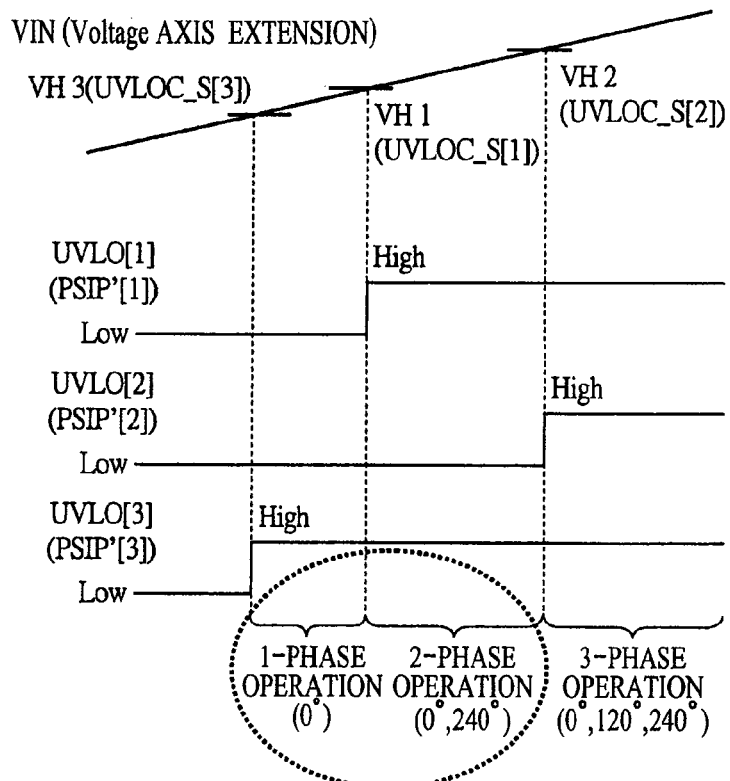

Prior to the description of a detailed operation of the configuration example shown in FIG. 7, problems found out by the present inventors et al. taken as the premise thereof will be explained herein. FIGS. 9(a) and 9(b) are schematic diagrams showing respective different configuration examples discussed as the premise of FIG. 7. FIG. 10 is a diagram for explaining a first problem where the configuration example of FIG. 9(a) is used. FIGS. 11(a) and 11(b) are diagrams for describing a second problem.

Firstly, consider a configuration in which a plurality of PWM-equipped drive units PSIP'[n] including such input voltage detection circuits UVLOC_S[n] as shown in FIG. 7, and an analog companion unit ACU including an input voltage detection circuit UVLOC_M are coupled by an error bus EB as shown in FIG. 9(a). Now assume that the power supply voltage VCC (e.g., 5V) of the analog companion unit ACU rises ahead of the input power supply voltage VIN (e.g., 12V) of each PSIP'[n] as shown in FIG. 10 at the start of operation of the power supply device. In doing so, the input voltage detection circuit UVLOC_M in the analog companion unit ACU detects that the power supply voltage VCC has risen and notifies it to a soft start controller SSCTL through the corresponding input voltage detection signal UVLOm. In response to it, the soft start controller SSCTL applies such a voltage as to rise gradually to the error amplifier EA. Correspondingly, the error amplifier signal EO output from the error amplifier EA also gradually rises over a period of 2 ms or so, for example.

Thereafter, when the input power supply voltage VIN of each PWM-equipped drive unit PSIP'[n] rises, the input voltage detection circuit UVLOC_S[n] in the PSIP'[n] detects that the input power supply voltage VIN has risen (has reached 8V, for example) and enables or makes effective its own internal circuit via the corresponding input voltage detection signal UVLO[n]. At this moment, however, the soft start period is already completed and the voltage level of the error amplifier signal EO becomes sufficiently high. Therefore, the PWM-equipped drive unit PSIP'[n] drives the internal transistors (power transistors) at the maximum on duty to rapidly raise the voltage of the output power supply node VO. In doing so, a large current is suddenly supplied to the corresponding load coupled to the output power supply node VO. This therefore results in the breakdown or the like of the load or produces overshoot in the voltage of the output power supply node VO, thus causing an unstable operation (e.g., oscillations or the like). Incidentally, when the soft start functions normally, the transistors (power transistors) are controlled within, for example, a range free of becoming the maximum on duty with a gentle rise in the voltage level of the error amplifier signal EO.

Consider as another problem, for example, where the input power supply voltage VIN of each PWM-equipped drive unit PSIP'[n] rises (falls) at slow speed as shown in FIG. 11(b), aside from the case in which the input power supply voltage VIN thereof rises (falls) at high speed as shown in FIG. 11(a). In this case, when fluctuations exist in the decision voltage level of the input voltage detection circuit UVLOC_S[n] included in each PWM-equipped drive unit PSIP'[n], timings provided to make itself effective for every PSIP'[n], become different from one another. In the example shown in FIG. 11(b), the PWM-equipped drive unit PSIP'[3] is first enabled or made effective with its corresponding input voltage detection signal UVLO[3]. Next, the PWM-equipped drive unit PSIP'[1] is made effective with its corresponding input voltage detection signal UVLO[1]. Subsequently, the PWM-equipped drive unit PSIP'[2] is made effective with its corresponding input voltage detection signal UVLO[2].

In doing so, for example, a PWM operation in a 1 phase (e.g., 0°) is performed while only the PWM-equipped drive unit PSIP'[3] is being effective. While the PWM-equipped drive units PSIP'[3] and PSIP'[1] are being effective, PWM operations in two phases (e.g., 0° and) 240° are performed. While the PWM operation in the 1 phase is however being carried out, an excessive current load might be added to each transistor in the PWM-equipped drive unit PSIP'[3], thus causing concern about the breakdown of the transistors. While the PWM operations in the two phases are being performed, unstable operations (such as oscillations, large output ripples, etc.) might occur with non-uniform multiphase operations in addition to the breakdown of the transistors. Namely, while the phases of 0° and 180° are required upon the two stable operations, 0° and 240° are used as the phases in this case.

It is therefore considered that in order to solve such a problem, such a configuration example as shown in FIG. 9(b) is used. FIG. 9(b) shows the configuration example in which an input voltage detection signal UVLO[n] output from an input voltage detection circuit UVLOC_S[n] included in each individual PWM-equipped drive unit PSIP'[n] is fed back to the corresponding analog companion unit ACU. The analog companion unit ACU performs an arithmetic operation on the input voltage detection signal UVLO[n] and an input voltage detection signal UVLOm outputted from its own input voltage detection circuit UVLOC_M through an AND circuit AD61. When all are of an 'H' level, the analog companion unit ACU starts the operation of its soft start controller SSCTL.

Thus, since the soft start can be started depending on timings for the input voltage detection signals UVLOm and UVLO[n] outputted latest from within each analog companion unit ACU and each PWM-equipped drive unit PSIP'[n], such a problem as described in FIG. 10 can be solved. Further, even though a difference occurs between the timings of the input voltage detection signals UVLO[n] at the respective PWM-equipped drive units PSIP'[n], the voltage of the error amplifier signal EO is kept at about 0V unless the input voltage detection signals UVLOm and UVLO[n] from the analog companion units ACU and the PWM-equipped drive units PSIP'[n] are all activated, thereby making it possible to solve such a problem as mentioned in FIG. 11(b). That is, since each PSIP'[n] does not perform the PWM operation unless the voltage of the error amplifier signal EO is at about 0V, even though itself is actually effective, the periods for the 1-phase and 2-phase operations do not occur.

Since, however, wirings for the input voltage detection signals UVLO[n], extending from the respective PWM-equipped drive units PSIP'[n] to the analog companion units ACU are required when such a configuration example as shown in FIG. 9(b) is used, a problem arises in that the number of wirings increases in a manner similar to the first embodiment or the like. It is therefore beneficial to use such a configuration example as shown in FIG. 7.

In FIG. 7, a wired logic operation on the input voltage detection signal UVLO[n] at each PWM-equipped drive unit PSIP[n] is performed using the error bus EB. That is, unless all of the input voltage detection signals ULVO[n] are brought to the 'H' level (active state), the voltage level of the error bus EB becomes a ground voltage GNG (0V) through any transistor Q1[n]. On the other hand, when the respective input voltage detection signals ULVO[n] are all brought to the 'H' level, the voltage level of the error bus EB becomes high impedance in a relationship with each input voltage detection signal ULVO[n]. Accordingly, the voltage level of the error bus EB at the high impedance can be determined by the corresponding error amplifier EA in the analog companion unit ACU.

Thus, the error amplifier EA may generate a voltage being not at least 0V to make it possible to detect the high impedance. Therefore, the error amplifier EA shown in FIG. 7 is provided with the resistor Ro1. For instance, when the current value of the bias current source IB1 is 200 µA, the resistance value of the resistor Ro1 is set to 500Ω or the like. In this case, the minimum output voltage value produced by the error amplifier EA becomes 0.1V (=200 µA×500Ω) and hence the voltage level of the error bus EB at the high impedance becomes also 0.1V. Accordingly, if the voltage level of the error bus EB is smoothed by the low-pass filter LPF, and the smoothed voltage is determined by the comparator CMP21 with a comparison voltage VTH (e.g., 50 mV) ranging between 0V and 0.1V being taken as the reference, it can be discriminated whether the error bus EB is high impedance in a relationship with each input voltage detection signal UVLO [n] (it can be determined whether all the UVLO[n] are of an 'H' level).

Further, the AND circuit AD21 performs an AND operation between the result of comparison by the comparator CMP21 and the corresponding input voltage detection signal UVLOm. Consequently, an enable signal EN_ACU for the analog companion unit ACU and an enable signal EN_MCU for the microcontroller unit MCU are activated at timings at which the input voltage detection signals UVLOm and UVLO[n] are all activated. The analog companion unit ACU starts the above-mentioned soft start in response to the activation of the enable signal EN_ACU (omitted in FIG. 7). Incidentally, since the error bus EB reaches the high impedance in the relationship with each UVLO[n] after the input voltage detection signals UVLO[n] have all been activated as mentioned above, a malfunction does not occur in particular during the subsequent normal operation using the error amplifier signal EO. Although the minimum output voltage value of the error amplifier signal EO becomes 0.1V or the like, a malfunction does not occur in particular during the normal operation using the error amplifier signal EO in the case of this degree of minimum voltage level. Incidentally, the resistor Ro1 is not limited in particular, but can be implemented by, for example, a diffused layer, a polysilicon layer or the like.

Figure 8:
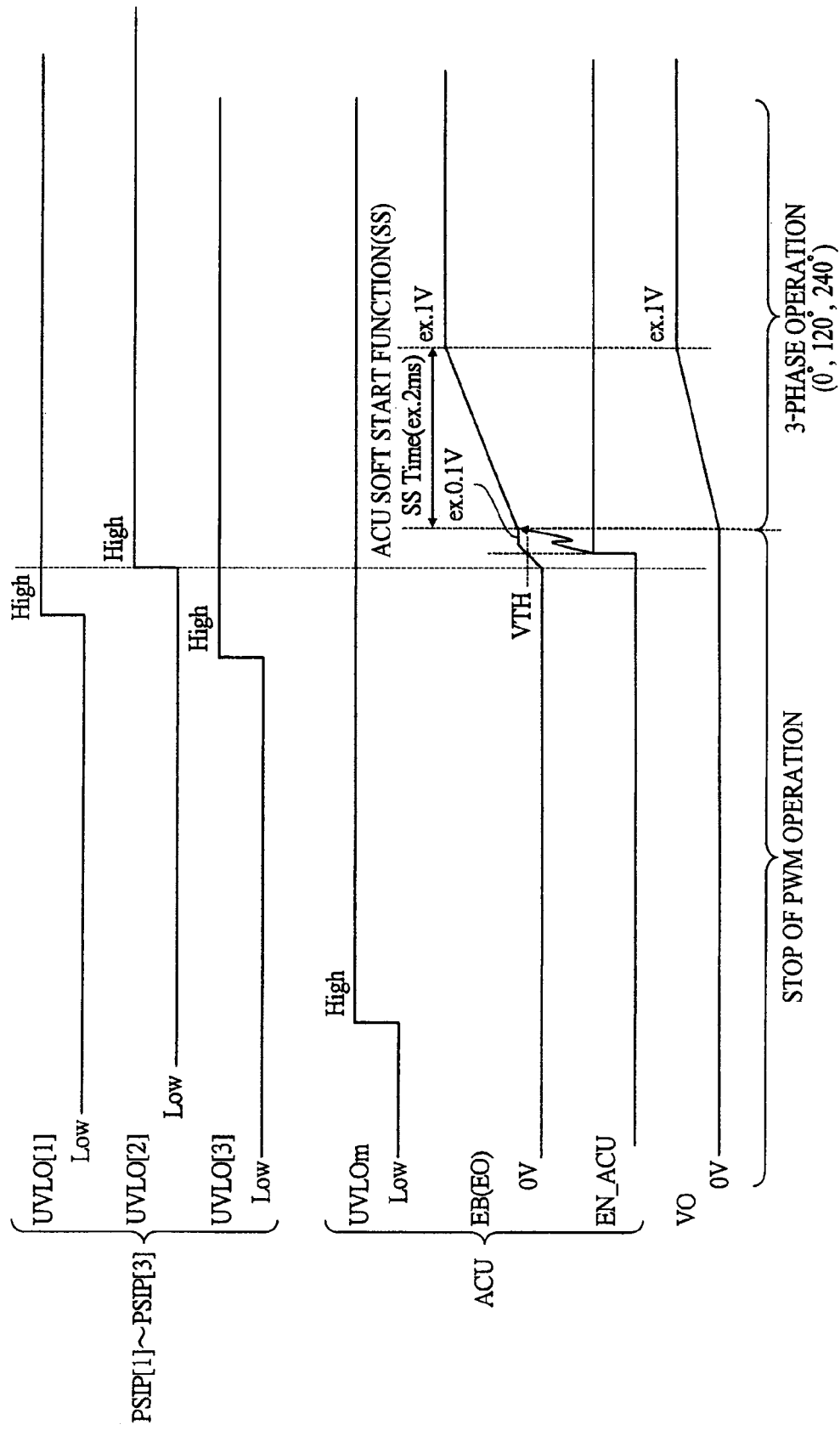
FIG. 8 is a waveform diagram depicting an operational example of FIG. 7.

FIG. 8 is a waveform diagram showing the operational example of FIG. 7. As is understood from the above description, when the configuration example of FIG. 7 is used, the voltage level of the error bus EB rises to, for example, 0.1V with the timing of the signal activated latest, of the input voltage detection signals UVLOm and UVLO[n] as a starting point, so that the enable signal EN_ACU for the analog companion unit ACU is activated at the stage of the voltage level exceeding the comparison voltage VTH. In response to the activation of the enable signal EN_ACU, a soft start operation is started. Consequently, the voltage of the output power supply node VO rises slowly.

Using the power supply device according to the third embodiment as described above typically enables realization of a stable (safety) operation at the start of the operation of the power supply device (or at the completion of its operation) without increasing the number of wirings. It is thus possible to enhance the reliability of the power supply device and make a size reduction in a power supply device using a multiphase system in a manner similar to the first embodiment. Incidentally, the configuration example of FIG. 7 is not, of course, limited to it, but may be modified as appropriate. Although, for example, the error amplifier EA of FIG. 7 takes the configuration in which the resistor Ro1 is added to the differential amplifier circuit whose original minimum output voltage value is 0V, and the voltage value thereof is raised, there is no particular need to add the resistor where there is used, for example, a differential amplifier circuit whose original minimum output voltage value is larger than 0V.

Fourth Embodiment

Figure 12:
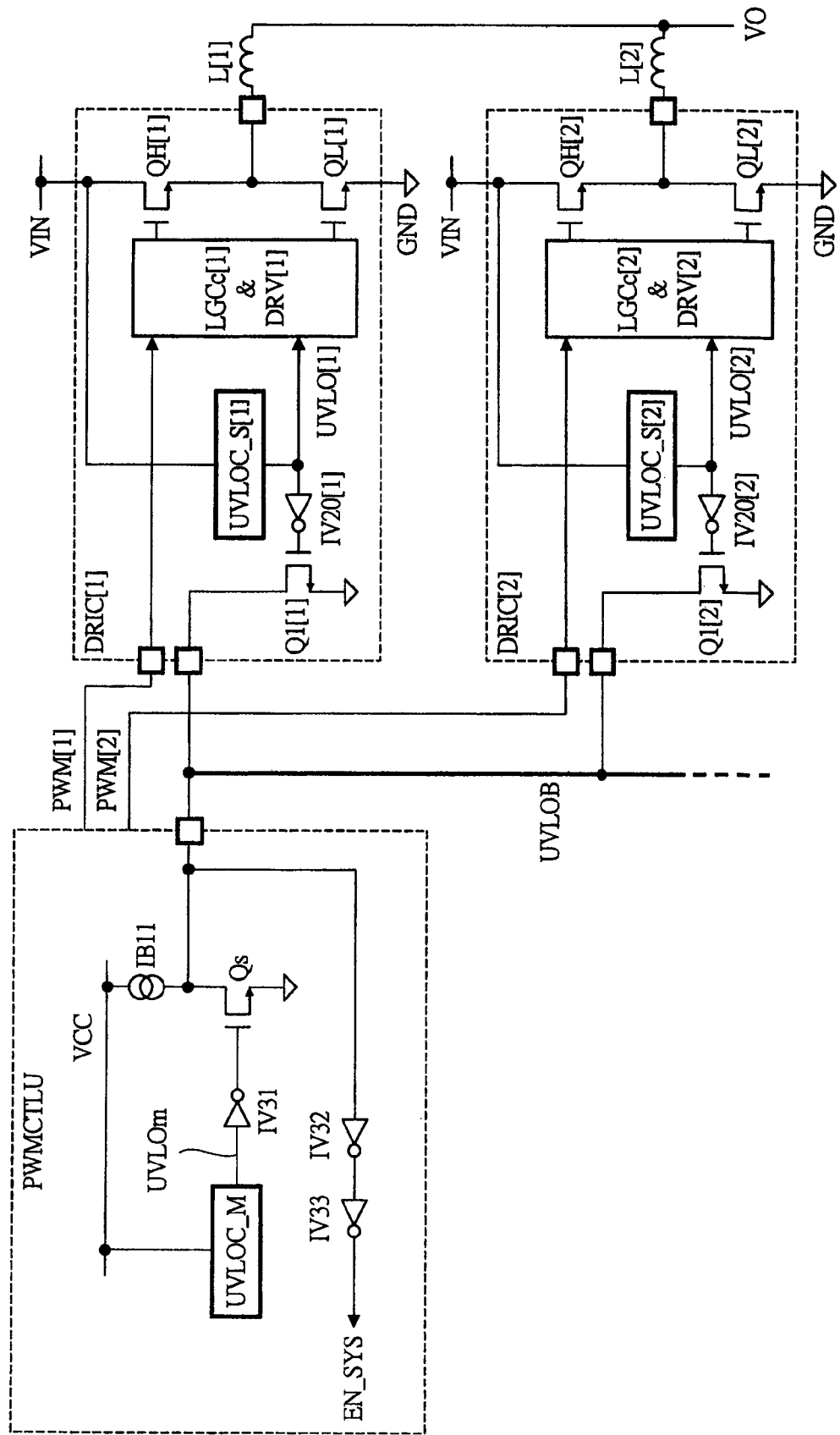
FIG. 12 is a schematic diagram showing one example of a configuration of a power supply device according to a fourth embodiment of the present invention.

A fourth embodiment will explain a modification of the third embodiment mentioned above. FIG. 12 is a schematic diagram showing one example of a configuration of a power supply device according to the fourth embodiment of the present invention. Although the power supply device shown in FIG. 7 is based on the premise that the error amplifier signal EO is supplied through the error bus EB as shown in FIGS. 1(a) and 1(b) and 25(a) and 25(b), such a system as described in the third embodiment can be applied even to, for example, the configuration free of such an error bus as shown in FIGS. 22(a) and 22(b).

Figure 22A:
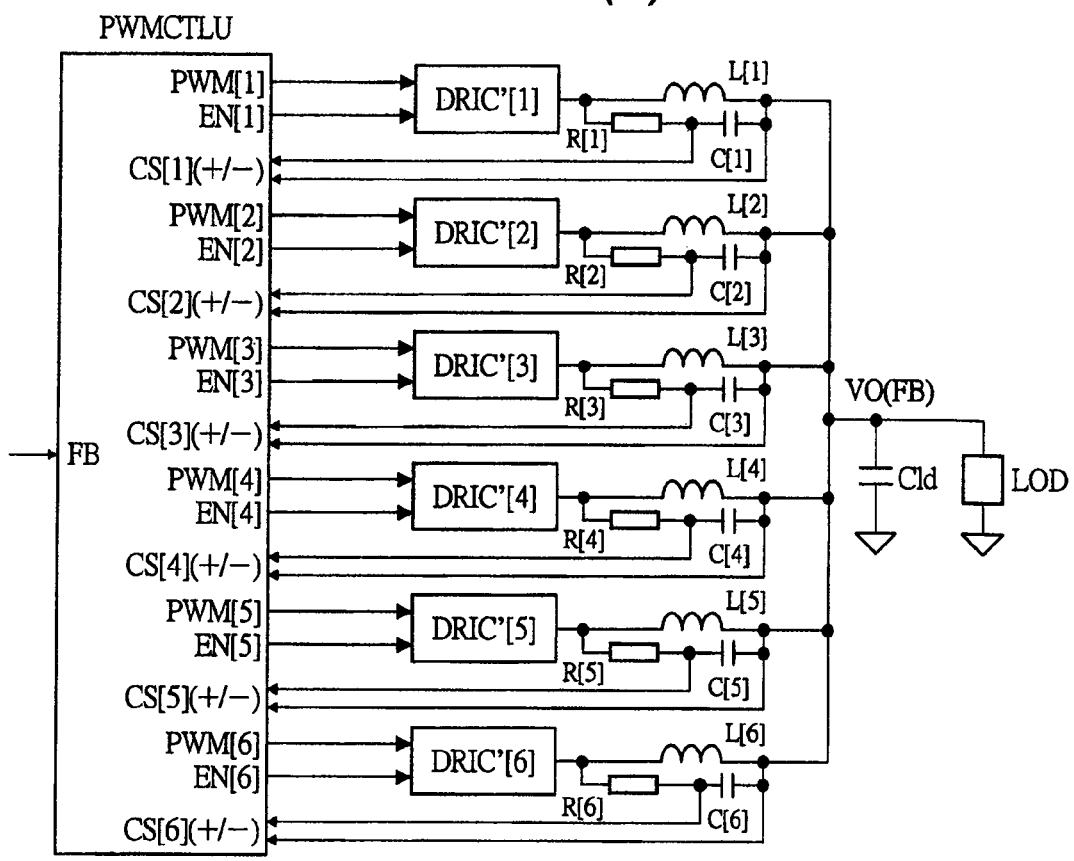
Figure 22B:
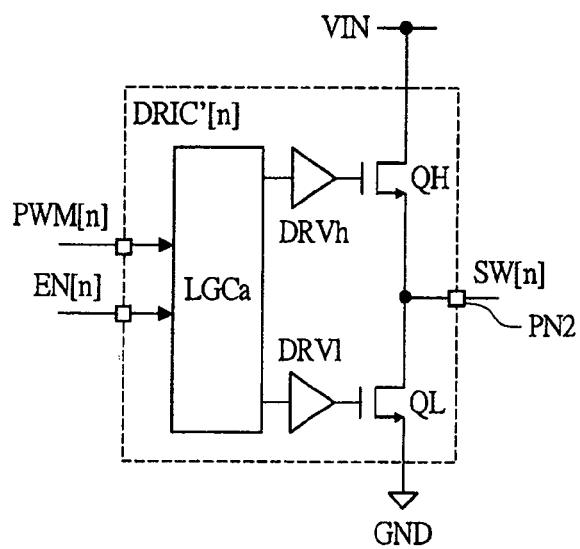

In a manner similar to FIGS. 22(a) and 22(b), the power supply device shown in FIG. 12 comprises a PWM control unit PWMCTLU, a plurality (two herein) of drive units DRIC[1] and DRIC[2], and a plurality of inductors L[1] and L[2]. The drive units DRIC[1] and DRIC[2] respectively perform a multiphase operation in response to PWM signals PWM[1] and PWM[2] output from the PWM control unit PWMCTLU. Here, each of the drive units DRIC[n] (where n=1 and 2) comprises an input voltage detection unit UVLOC_S[n], an inverter IV20[n], and a transistor Q1[n] in a manner similar to FIG. 7. The transistor Q1[n] is however coupled to an UVLO bus UVLOB provided for exclusive use instead of the error bus EB described in FIG. 7.

On the other hand, the PWM control unit PWMCTLU comprises a bias current source IB11, a transistor (NMOS transistor) Qs, inverters IV31 through IV33, and an input voltage detection circuit UVLOC_M. The bias current source IB11 has one end coupled to a power supply voltage VCC and the other end coupled to the UVLO bus UVLOB. The transistor Qs has a source coupled to a ground power supply voltage GND, and a drain coupled to the UVLO bus UVLOB. In a manner similar to FIG. 7, the input voltage detection circuit UVLOC_M outputs an 'H' level to an input voltage detection signal UVLOm when the power supply voltage VCC exceeds a predetermined voltage. A gate of the transistor Qs is controlled by an inverted signal of the input voltage detection signal UVLOm though the inverter IV31. The UVLO bus UVLOB is coupled to an input of the inverter IV32. A system enable signal EN_SYS is thereafter outputted through the inverter IV33 provided in a stage subsequent to the inverter IV32.

Thus, the power supply device shown in FIG. 12 performs wired logic operations on the UVLO bus UVLOB inclusive of the input voltage detection signal UVLOm in addition to the wired logic operations between the respective input voltage detection signals UVLO[n] in FIG. 7. That is, when the input voltage detection signals UVLOm and UVLO[n] are all brought to an 'H' level, the voltage level of the UVLO bus UVLOB rises to the power supply voltage VCC, so that the system enable signal EN_SYS is activated. On the other hand, when either of the input voltage detection signals UVLOm and UVLO[n] is of an 'L" level, the voltage level of the UVLO bus UVLOB is fixed to the ground power supply voltage GND, so that the system enable signal EN_SYS is inactivated.

Using the power supply device according to the fourth embodiment as described above typically enables realization of a stable (safety) operation at the start of the operation of the power supply device (or at the completion of its operation) without increasing the number of wirings in a manner similar to the case of the third embodiment.

Figure 21A:
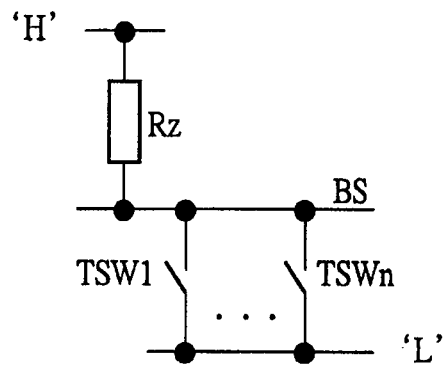
FIGS. 21(a) and 21(b) are circuit diagrams for complementing FIGS. 7 and 12 respectively.
Figure 21B:
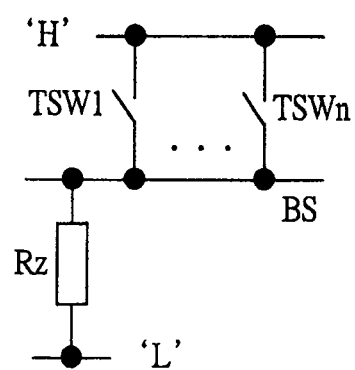

Incidentally, the configuration example shown in FIG. 12 is not, of course, limited to it, but may be modified as appropriate. For example, each of the configuration examples shown in FIGS. 12 and 7 is provided with such a wired logic circuit as shown in FIG. 21(a) as the principle. That is, in FIG. 21(a), the voltage of a bus BS becomes an 'H' level through a high resistor Rz where switches TSW1 through TSWn are all turned off, whereas the voltage thereof becomes an 'L' level through any of the switches TSW1 through TSWn at other times. When the error bus EB is used as in the configuration example of FIG. 7, such a system as shown in FIG. 21(a) is normally required due to the restriction on a bus's voltage. When, however, there is no particular limitation on the bus's voltage as in the configuration example of FIG. 12, the principle whose logic is modified can also be used as shown in FIG. 21(b). That is, in FIG. 21(b), the voltage of a bus BS becomes an 'L' level through a high resistor Rz where switches TSW1 through TSWn are all turned off, and becomes an 'H' level through any of the switches TSW1 through TSWn at other times.

Fifth Embodiment

Figure 13:
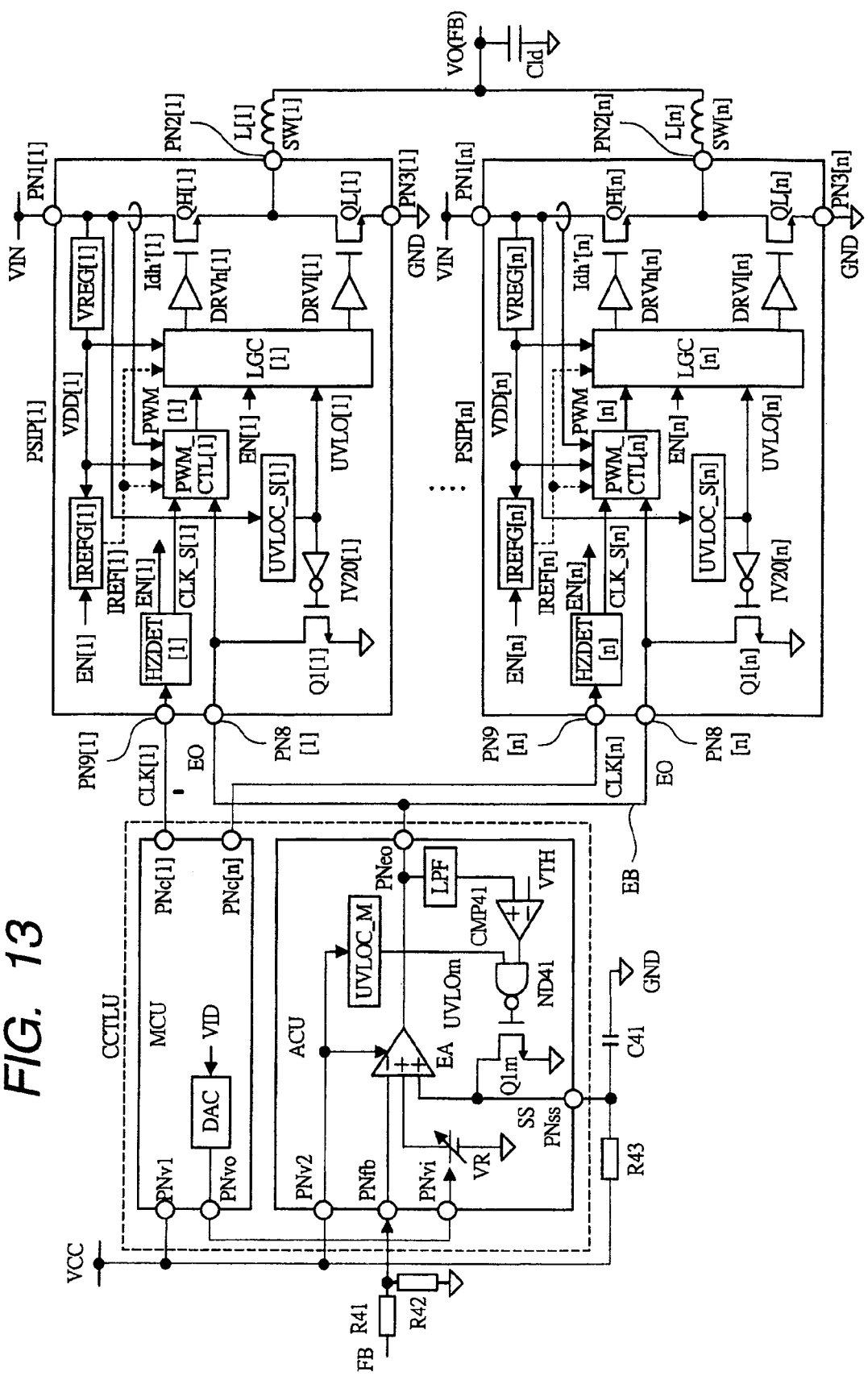
FIG. 13 is a schematic diagram illustrating one example of a configuration of a power supply device according to a fifth embodiment of the present invention.

A fifth embodiment will explain a power supply device which combines the configurations described in the first through third embodiments. FIG. 13 is a schematic diagram illustrating one example of a configuration of the power supply device according to the fifth embodiment of the present invention. The power supply device shown in FIG. 13 comprises a common control unit CCTLU, a plurality (n) of PWM-equipped drive units PSIP[1] through PSIP[n], and a plurality (n) of inductors L[1] through L[n]. The inductors L[1] through L[n] respectively have one ends coupled to an output power supply node VO.

The common control unit CCTLU comprises a microcontroller unit MCU and an analog companion unit ACU. The microcontroller unit MCU includes n external terminals PNc[1] through PNc[n], and two external terminals PNv1 and PNvo. The external terminal PNv1 is supplied with a power supply voltage VCC, and clock signals CLK[1] through CLK[n], which are identical in frequency and different in phase respectively, are respectively outputted from the external terminals PNc[1] through PNc[n]. The microcontroller unit MCU is provided with a digital-analog converter DAC, which is inputted with a digital code of plural bits (called VID code) indicative of a set voltage of the output power supply node VO and outputs an analog voltage corresponding thereto from the external terminal PNvo. Although not limited in particular, the set voltage can be selected in steps of a few tens of mV or the like from within a voltage range of, for example, 0.8V to 1.8V or the like by the VID code.

The analog companion unit ACU includes five external terminals PNv2, PNf, PNvi, PNss and PNeo. The external terminal PNv2 is supplied with the power supply voltage VCC and the PNvi is inputted with an analog voltage from the digital-analog converter DAC included in the microcontroller unit MCU. An output voltage detection signal FB at the output power supply node VO is divided by resistors R41 and R42, after which its divided voltage is inputted to the external terminal PNfb. The external terminal PNss is of a soft start terminal, which is coupled to an external capacitor C41 coupled between the external terminal PNss and a ground power supply voltage GND and which is coupled to an external resistor R43 coupled between the external terminal PNss and the power supply voltage VCC.

The analog companion unit ACU comprises an error amplifier EA, a variable voltage source VR, an input voltage detection circuit UVLOC_M, a comparator CMP41, a NAND circuit ND41, a transistor (NMOS transistor) Q1m, and a low-pass filter LPF. The error amplifier EA has one (−) input and two (+) inputs and outputs an error amplifier signal EO through the PNeo. A voltage at the (−) input is amplified with either low one of voltages at the two (+) inputs as the reference. The (−) input of the error amplifier EA is coupled to the external terminal PNfb, and one of the (+) inputs is coupled to the variable voltage source VR and the other thereof is coupled to the external terminal PNss. The variable voltage source VR generates a voltage corresponding to the analog voltage form the external terminal PNvi.

The input voltage detection circuit UVLOC_M outputs an 'H' level to an input voltage detection signal UVLOm when the voltage of the power supply voltage VCC exceeds a predetermined voltage. The comparator CMP41 takes in the voltage level of the external terminal PNeo via the low-pass filter LPF and determines it with a comparison voltage VTH as the reference. The NAND circuit ND41 performs a NAND operation on the input voltage detection signal UVLOm and the output of the comparator CMP41 and thereby controls a gate of the transistor Q1m. The transistor Q1m has a source coupled to the ground power supply voltage GND and a drain coupled to the external terminal PNss.

The input voltage detection circuit UVLOC_M, the low-pass filter LPF, the comparator CMP41, the NAND circuit ND41 and the transistor Q1m realize functions similar to the analog companion unit ACU described in FIG. 7. Namely, when the voltage level of the external terminal PNeo reaches high impedance in relationships with input voltage detection signals UVLO[1] through UVLO[n] in the PWM-equipped drive units PSIP[1] through PSIP[n], an 'H' level is outputted via the comparator CMP41. When the input voltage detection signal UVLOm is also at the 'H' level in addition to this state, the NAND circuit ND41 outputs an 'L' level, so that the transistor Q1m is driven to off. In doing so, charging for the capacitor C41 is started at the external terminal PNss, and the charged voltage is inputted to the error amplifier EA to start or initiate a soft start.

Since the PWM-equipped drive units PSIP[1] through PSIP[n] are respectively provided with similar configurations, and their internal configurations are also respectively similar to the configurations shown in FIGS. 1(a) and 1(b) and FIG. 7 and the like, parts similar to those in FIGS. 1(a) and 1(b) and FIG. 7 and the like will briefly be explained in avoidance of dual explanations. Each of the PWM-equipped drive units PSIP[n] (where n=1, 2, . . . ) is equipped with five external terminals PN1[n], PN2[n], PN3[n], PN8[n] and PN9[n]. The external terminal PN1[n] is supplied with an input power supply voltage VIN, and the external terminal PN3[n] is supplied with the ground power supply voltage GND. The error amplifier signal EO output from the analog companion unit ACU is inputted to the external terminal PN8[n], and the clock signal CLK[n] output from the microcontroller unit MCU is inputted to the external terminal PN9[n]. A switch signal SW[n] is generated at the external terminal PN2[n], and the other end of the inductor L[n] is coupled to the external terminal PN2[n].

Each of the PWM-equipped drive units PSIP[n] further includes transistors (power transistors) QH[n] and QL[n], drivers DRVh[n] and DRVl[n], control logic LGC[n], a PWM controller PWM_CTL[n], and a high impedance detector HZDET[n]. These configurations are similar to those shown in FIGS. 1(a) and 1(b). The high impedance detector HZDET[n] corresponds to the enable detector ENDET shown in each of FIGS. 1(a) and 1(b). Its concrete configuration example corresponds to that shown in each of FIGS. 3 and 5. Each enable detector HZDET[n] generates an enable signal EN[n] and an internal clock signal CLK_S[n] from the clock signal CLK[n] inputted from the external terminal PN9[n]. The PWM controller PWM_CTL[n] performs a PWM operation with the edge of the clock signal CLK_S[n] as a start point, determines an on duty depending upon the result of comparison between the error amplifier signal EO and a current Idh' [n] detected from a current flowing through the corresponding transistor QH[n], and generates a PWM signal PWM[n] having the on duty.

The PWM-equipped drive unit PSIP[n] further includes an input voltage detection circuit UVLOC_S[n], an inverter IV20[n], and a transistor Q1[n]. These configurations are similar to those shown in FIG. 7. When the respective input voltage detection signals UVLO[1] through UVLO[n] generated from the input voltage detection circuits of the PWM-equipped drive units PSIP[1] through PSIP[n] are all brought to an active state ('H' level), an error bus EB coupled commonly to the external terminals PN8[1] through PN8[n] becomes high impedance in a relationship with the input voltage detection signals.

Further, each PWM-equipped drive unit PSIP[n] has a regulator VREG[n] and a reference current generator IREFG[n]. The regulator VREG[n] generates an internal power supply voltage VDD[n] (e.g., 5V or the like) in response to the input power supply voltage VIN (e.g., 12V or the like). The control logic LGC[n], PWM controller PWM_CTL[n], high impedance detector HZDET[n] and the like are operated in response to the internal power supply voltage VDD[n]. Each reference current generator IREFG[n] generates predetermined plural reference currents IREF[n] in response to the internal power supply voltage VDD[n]. The reference currents IREF[n] are respectively supplied to the PWM controller PWM_CTL[n] or even to the control logic LGC[n] in addition to the PWM controller PWM_CTL[n] and become bias currents necessary for these internal circuits. The reference current generator IREFG[n] stops some or all of the plural reference currents IREF[n] in response to the inactivation of the enable signal EN[n] from the high impedance detector HZDET[n]. Consequently, each PSIP[n] is brought to a power saving mode.

Figure 14:
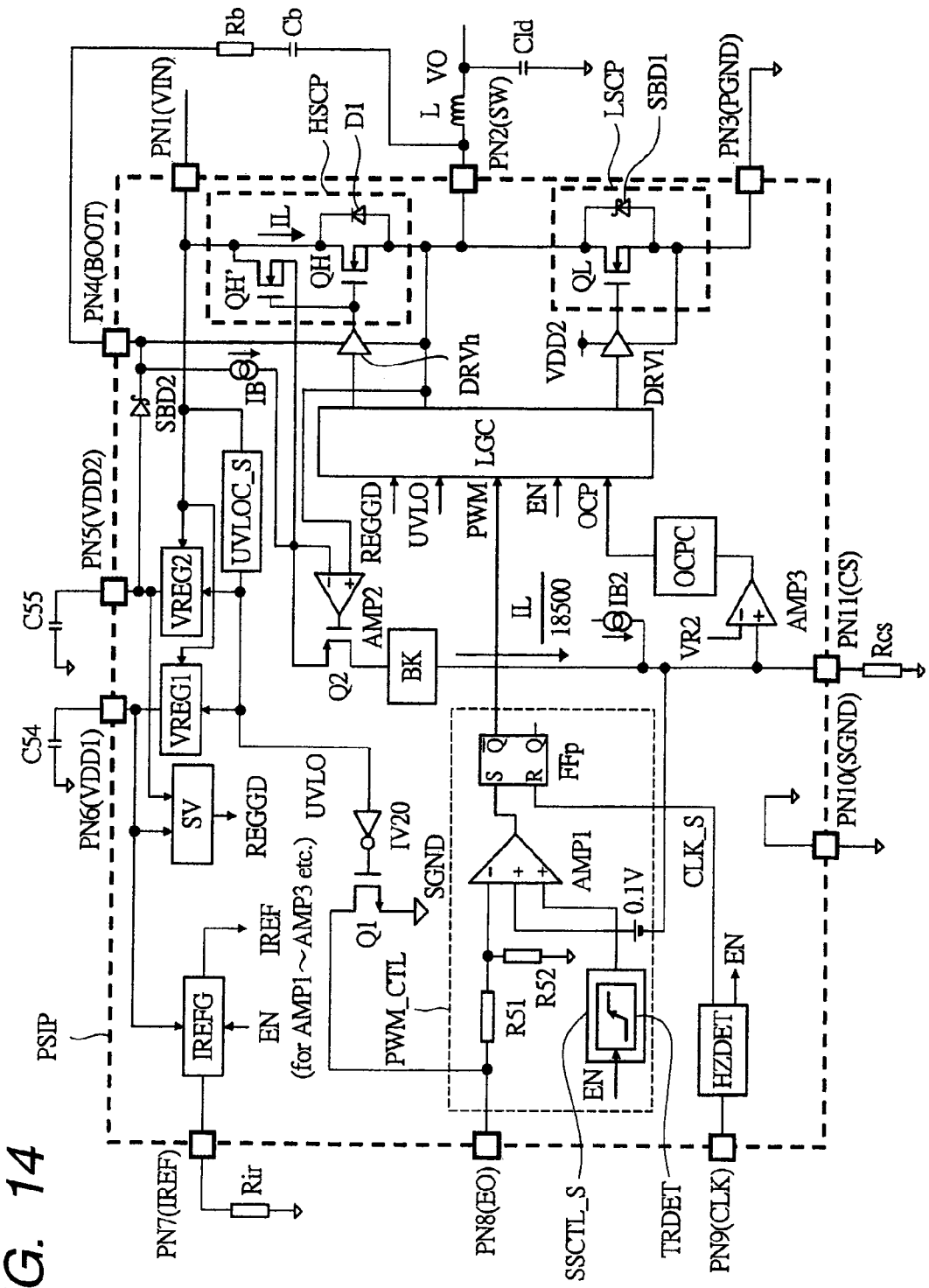
FIG. 14 is a block diagram depicting a detailed configuration example of a PWM-equipped drive unit shown in FIG. 13.

FIG. 14 is a block diagram showing a detailed configuration example of the PWM-equipped drive unit (PSIP) shown in FIG. 13. As shown in FIG. 14, the PWM-equipped drive unit (PSIP), which serves as a semiconductor device, is broadly divided into high side transistors (power transistors) QH and QH', a low side transistor (power transistor) QL and a circuit group other than these and comprises various control circuits for controlling respective transistors. The transistors QH, QH' and QL are of n channel MOSFETs, for example. The transistors QH and QH' are formed within a high side semiconductor chip HSCP, the low side transistor QL is formed within a low side semiconductor chip LSCP, and the various control circuits other than those are formed within a control semiconductor chip CTLCP. As will be described later, these semiconductor chips are mounted in, for example, one semiconductor package. A diode D1 is formed between the source and drain of the high side transistor QH, and a schottky diode SBD1 is formed between the source and drain of the low side transistor QL. The schottky diode SBD1 is capable of reducing a voltage drop developed with a current path on the low side transistor QL side during a dead time up to the turning on of the low side transistor QL after the turning off of the high side transistor QH.

The high side transistor QH has a gate driven by its corresponding driver DRVh, a drain coupled to an external terminal PN1 supplied with an input power supply voltage VIN, and a source coupled to an external terminal (output terminal) PN2 which serves as a terminal used to generate a switch signal SW. The low side transistor QL has a gate driven by its corresponding driver DRVl, a drain coupled to the external terminal PN2 (SW), and a source coupled to an external terminal PN3 supplied with a ground power supply voltage PGND. The external terminal PN3 (PGND) is used as a terminal dedicated to the transistors QH and QL. The external terminal PN3 is provided in isolation from a ground power supply voltage SGND for the various control circuits and the like so as not to give switching noise to other various control circuits and the like. The high side transistor QH' has a gate driven by the driver DRVh, a drain coupled to the external terminal PN1 (VIN), and a source coupled to a source of the transistor (PMOS transistor) Q2. The high side transistor QH' is formed so as to configure a current mirror circuit with the high side transistor QH within the high side semiconductor chip HSCP and has a size of $1/18500$ of the high side transistor QH.

Here, the source (SW) of the high side transistor QH and the source of the high side transistor QH' are respectively coupled to two input nodes of an amplifier AMP2. A gate of the transistor Q2 is driven by an output node of the amplifier AMP2. The high side transistor QH' is of an element for detecting a current IL flowing through the high side current QH. When the voltages at the sources of the high side transistors QH' and QH are equal to each other, a current of IL/18500 flows through the high side transistor QH' by the current mirror configuration. Therefore, the amplifier AMP2 and the transistor Q2 are provided to equalize the source voltages of the high side transistors QH' and QH and detect the current of the high side transistor QH with a high degree of accuracy. A bias current source IB is coupled to the source of the transistor Q2. The bias current source IB is provided to be able to control the source voltages of the high side transistors QH and QH' equally even where the current IL of the high side transistor QH is almost zero.

The current detected by the high side transistor QH' is inputted to a blanking circuit BK via the transistor Q2. The blanking circuit BK sets a switching period of each of the transistors QH and QL as a mask period (e.g., a few tens of ns) and supplies a current detection signal CS produced by the high side transistor QH' to an external terminal PN11. An external resistor Rcs for current-voltage conversion is coupled to the external terminal PN11 (CS), whereby the current detection signal CS is converted to its corresponding voltage. Incidentally, a bias current source IB2 for adjusting an offset voltage to achieve voltage stabilization is coupled to the external terminal PN11 (CS).

The driver DRVh drives the high side transistors QH and QH', based on control from the corresponding control logic LGC. The driver DRVl drives the low side transistor QL, based on control from the control logic LGC. The input power supply voltage VIN (e.g., 12V or the like) from the external terminal PN1 is supplied to its corresponding input voltage detection circuit UVLOC_S and regulators VREG1 and VREG2. The input voltage detection circuit UVLOC_S detects that the input power supply voltage VIN is greater than or equal to a predetermined voltage (e.g., 8V or the like). In that case, the input voltage detection circuit UVLOC_S makes effective the operations of the regulators VREG1 and VREG2 through an input voltage detection signal UVLO.

The regulators VREG1 and VREG2 respectively generate an internal power supply voltage like about 5V in response to the input power supply voltage VIN. The regulator VREG1 supplies the generated internal power supply voltage VDD1 to the various control circuits and outputs it to an external terminal PN6. The regulator VREG2 supplies the generated interval power supply voltage VDD2 to the drivers DRVh and DRVl and the like and outputs it to an external terminal PN5. Capacitors C54 and C55 for voltage stabilization are respectively coupled to the external terminals PN6 (VDD1) and PN5 (VDD2).

Since the drivers DRVh and DRVl drive the transistors QH, QH' and QL respectively herein, relatively large currents are required and a lot of noise are generated. On the other hand, since other various control circuits include many analog circuits such as the amplifiers thereinside, there is a need to reduce power supply noise. Therefore, their power supplies are individually generated by the two regulators VREG1 and VREG2. A regulator voltage supervisory circuit SV monitors the internal power supply voltages generated by the regulators VREG1 and VREG2 and outputs an internal power supply enable signal REGGD where it falls within a predetermined range.

A step-up or boost voltage BOOT is generated at the external terminal PN4 and supplied as the power supply voltage for the driver DRVh. The external terminal PN4 (BOOT) is coupled to the external terminal PN5 (VDD2) via a schottky diode SBD2 and coupled to the external terminal (output terminal) PN2 (SW) through a boost external capacitor Cb and an external resistor Rb. When the high side transistor QH is turned off, the internal power supply voltage VDD1 is applied to the boost external capacitor Cb via the schottky diode SBD2 and the external terminal PN4 (BOOT). Thereafter, when the high side transistor QH is turned on, the input power supply voltage VIN transferred to the external terminal SW is boosted by the boost external capacitor Cb, which in turn is supplied to the driver DRVh. Consequently, the driver DRVh can generate a voltage greater than or equal to the threshold value of the high side transistor QH.

The control logic LGC performs operations in response to an internal power supply enable signal REGGD, an input voltage detection signal UVLO, a PWM signal (PWM), an enable signal EN and an overcurrent detection signal OCP. The internal power supply enable signal REGGD is generated from the regulator voltage supervisory circuit SV, the input voltage detection signal UVLO is generated from the input voltage detection circuit UVLOC_S, the PWM signal (PWM) is generated from the PWM controller PWM_CTL, the enable signal EN is generated from the high impedance detector HZDET, and the overcurrent detection signal OCP is generated from an overcurrent detection circuit OCPC. The overcurrent detection circuit OCPC performs an operation in response to the output of an amplifier AMP3. The amplifier AMP3 compares the voltage of the external terminal PN11 (CS) and a comparison voltage VR2 and outputs the result of comparison therebetween to the overcurrent detection circuit OCPC. The overcurrent detection circuit OCPC inactivates the overcurrent detection signal OCP depending on the result of comparison where the voltage of the CS is excessive (i.e., when overcurrent flows through the high side transistor QH).

The control logic LGC controls the drivers DRVh and DRVl using the PWM signal (PWM) where the respective signals REGGD, UVLO, EN and OCP are being activated together. On the other hand, when any of these is inactivated, the control logic LGC controls the drivers DRVh and DRVl to off together. Here, the activation of the internal power supply enable signal REGGD means that each internal power supply voltage is sufficiently generated, and the activation of the input voltage detection signal UVLO means that the input power supply voltage VIN is of a sufficient voltage. The activation of the enable signal EN means that a command for making a device effective is inputted from outside, and the activation of the overcurrent detection signal OCP means that no overcurrent flows through the high side transistor QH. A clock signal CLK is inputted to an external terminal PN9. The clock signal CLK is inputted to the high impedance detector HZDET as described above. Hence, the high impedance detector HZDET generates an enable signal EN and an internal clock signal CLK_S.

The PWM controller PWM_CTL comprises resistors R51 and R52, an amplifier AMP1, a flip-flop FFp, and a soft start controller SSCTL_S. The resistors R51 and R52 divide an error amplifier signal EO input from an external terminal PN8 and applies the divided voltage to a (−) input node of the amplifier AMP1. A signal obtained by applying an offset voltage (0.1V herein) to the current detection signal CD obtained from the external terminal PN11 is applied to one (+) input node of the amplifier AMP1. A signal outputted from the soft start controller SSCTL_S is applied to the other (+) input node of the amplifier AMP1. The amplifier AMP1 amplifies the voltage of the (−) input node with either low one of the voltages of the two (+) input nodes as the reference.

The soft start controller SSCTL_S includes a rising edge detector TRDET for detecting the rising edge of the enable signal EN. When this detection is done, the soft start controller SSCTL_S generates a voltage that rises gradually. The soft start controller SSCTL_S is used where some phases are made invalid by the enable signal EN according to the state of current consumption of a load LOD in the process of a multiphase operation and thereafter made valid again. That is, since the voltage of the error amplifier signal EO from the external terminal PN8 becomes high when the enable signal EN is made effective, a reset operation is performed by a soft start using the soft start controller SSCTL_S. The flip-flop FFp performs a set operation according to the output of the amplifier AMP1 and performs a reset operation according to the internal clock signal CLK_S. Then, an inverted output signal (/Q) from the flip-flop FFp is outputted to the control logic LGC as a PWM signal (PWM).

The reference current generator IREFG operates in accordance with the internal power supply voltage VDD1 and generates a plurality of reference currents IREF according to a reference current setting resistor Rir coupled to an external terminal PN7. The reference currents IREF are supplied to the various control circuits inclusive of the operating currents of the amplifiers AMP1 through AMP5, for example. When the enable signal EN is inactivated, the reference current generator IREFG stops the generation of some or all of the plural reference currents IREF and thereby proceeds to a power saving mode.

As mentioned above, a transistor (NMOS transistor) Q1 is coupled to the external terminal PN8 (EO) between the external terminal PN8 and the ground power supply voltage SGND. A gate of the transistor Q1 is controlled by the input voltage detection signal UVLO (signal inverted via an inverter IV20 herein) generated from the input voltage detection circuit UVLOC_S. Incidentally, the ground power supply voltage SGND is supplied from an external terminal PN10.

Figure 15:
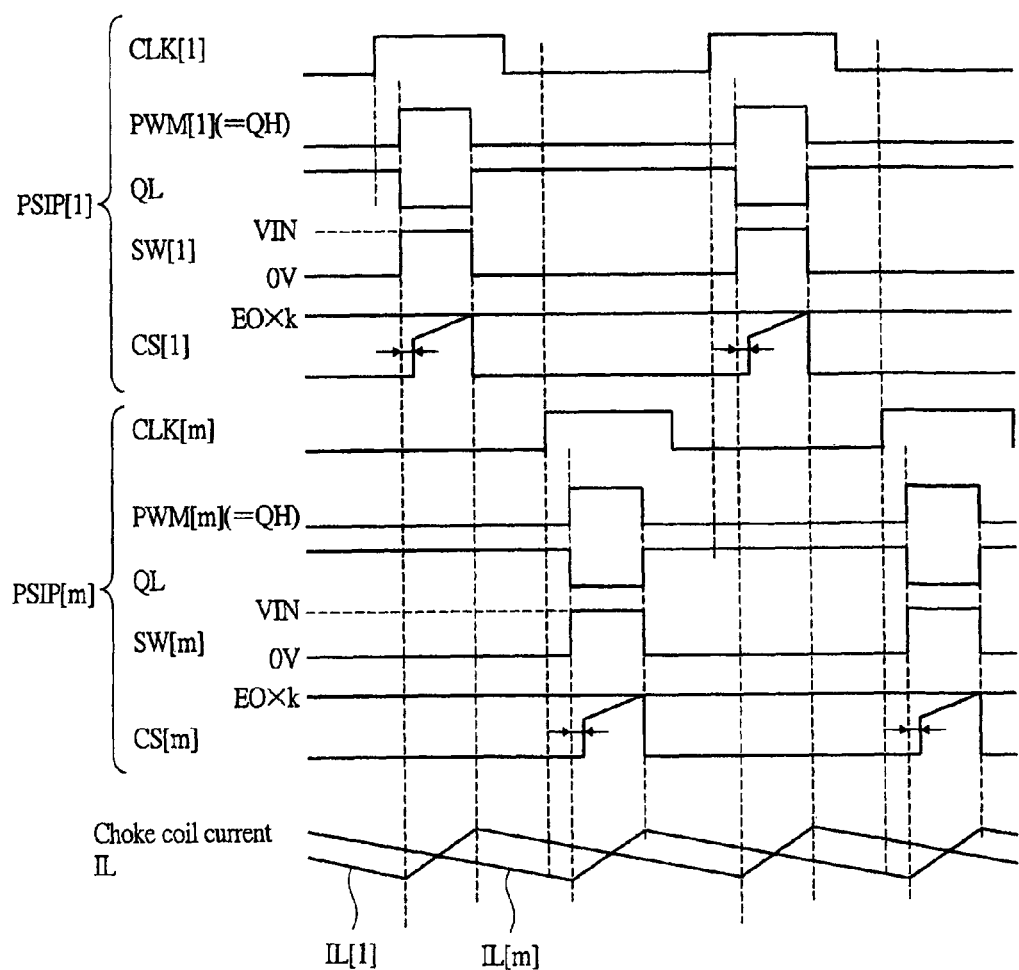
FIG. 15 is a waveform diagram showing schematic operational examples at normal times where the configuration examples of FIGS. 13 and 14 are used.

FIG. 15 is a waveform diagram showing schematic operational examples at normal times where the configuration examples of FIGS. 13 and 14 are used. A description will be made here of, as an example, a case in which the PWM-equipped drive units PSIP[1] and PSIP[m] are made effective by their corresponding enable signals EN[1] and EN[m] (where m≤n) from within the PWM-equipped drive units PSIP[1] through PSIP[n] shown in FIG. 13 and a two-phase operation is performed. First, the PMW-equipped drive unit PSIP[1] drives the high side transistor QH to an 'H' level (i.e., on) through a predetermined delay time in response to the rising edge of a clock signal CLK[1] and drives the low side transistor QL to an 'L' level (i.e., off). Incidentally, although it is necessary to actually provide timing provided to perform switching between the high side transistor QH and the low side transistor QL with a dead time, it will be omitted here. When the high side transistor QH is driven to on, the voltage of a switch signal SW[1] becomes the input power supply voltage VIN.

Since the voltage of the switch signal SW[1] is applied to its corresponding inductor L[1], a ramp waveform-like current that rises at a predetermined inclination flows through the high side transistor QH. This current is detected by the high side transistor QH' shown in FIG. 14 and converted into the voltage through the external terminal PN11, after which it becomes a current detection signal CS[1]. Although a predetermined mask time is provided here until the voltage occurs in the current detection signal CS[1] from the turning on of the high side transistor QH by the blanking circuit BK of FIG. 14, this is done to prevent a malfunction due to the detection of a spike current with switching. Although not illustrated in the figure, the spike current accompanies a recovery current of a body diode coupled to the low side transistor QL.

When the voltage of the current detection signal CS[1] reaches the error amplifier signal EO (in which a constant k accompanying the resistors R51 and R52 is reflected in the example shown in FIG. 14) inputted from the external terminal PN8, the PWM-equipped drive unit PSIP[1] drives the high side transistor QH to an 'L' level (i.e., off) and drives the low side transistor QL to an 'H' level (i.e., on). When the low side transistor QL is turned on (the high side transistor QH is turned off), the current continues to flow through the inductor L[1] along a path extending via the low side transistor QL due to energy accumulated in the inductor L[1]. As a result, the current IL[1] flowing through the inductor L[1] rises or increases at a predetermined inclination while the high side transistor QH is on (the low side transistor QL is off), and decreases at a predetermined inclination while the low side transistor QL is on (the high side transistor QH is off).

When a CLK[m] is inputted through a phase difference of 180° from the clock signal CLK[1], the corresponding PWM-equipped drive unit PSIP[m] performs an operation similar to the PWM-equipped drive unit PSIP[1] in response to the rising edge of the clock signal CLK[m]. As a result, a current IL[2] of the inductor L[2] is generated in the form of being delayed a half cycle from the current Il[1] of the inductor L[1]. A predetermined output power supply voltage is generated at the output power supply node VO when electrical charges with the currents IL[1] and IL[2] are supplied to a capacitor Cld. The load LOD performs a desired operation in accordance with the output power supply voltage. Although not limited in particular, the input power supply voltage VIN is 12V, the output power supply voltage is 1.0V, and the currents IL[1] and IL[2] are respectively a few tens of A or the like.

Figure 16:
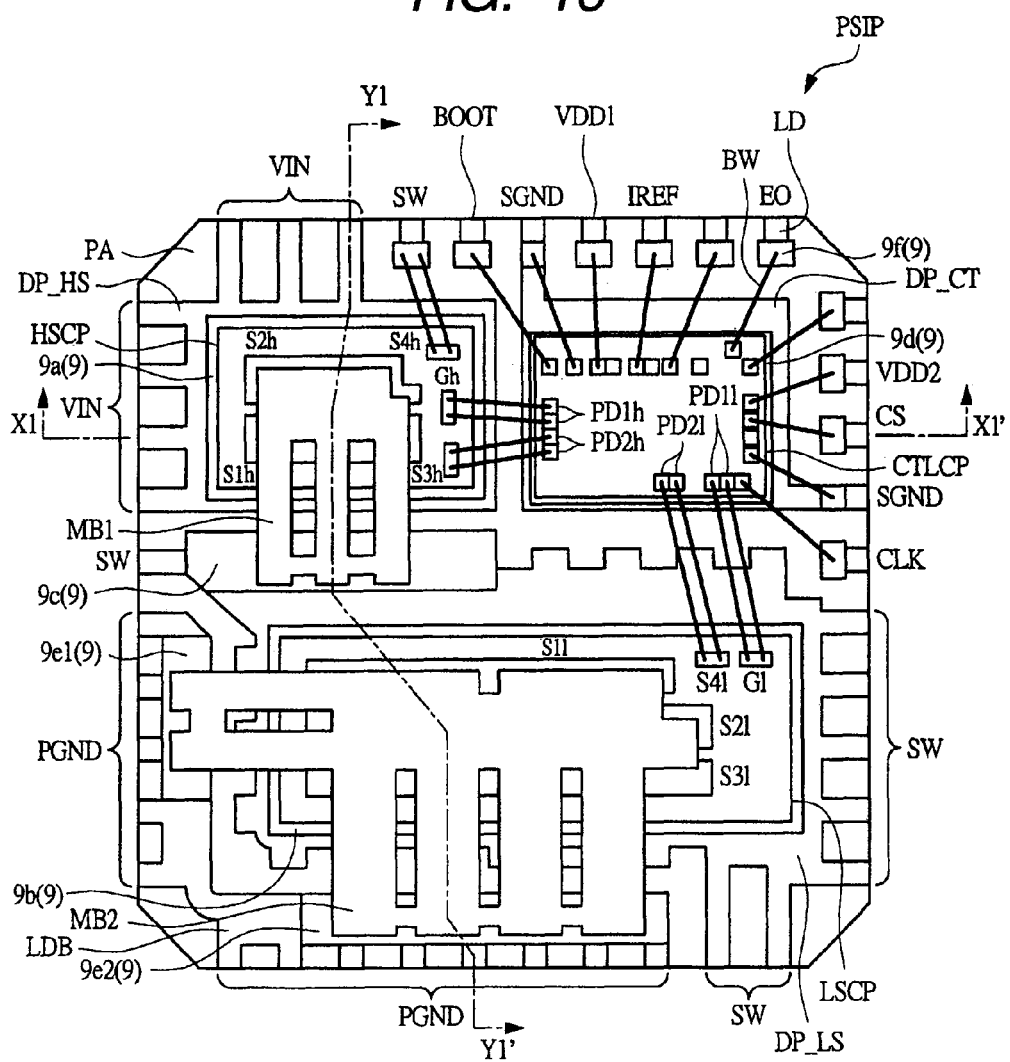
FIG. 16 is a plan view illustrating an outline example of the PWM-equipped drive unit shown in FIG. 14.
Figure 17A:
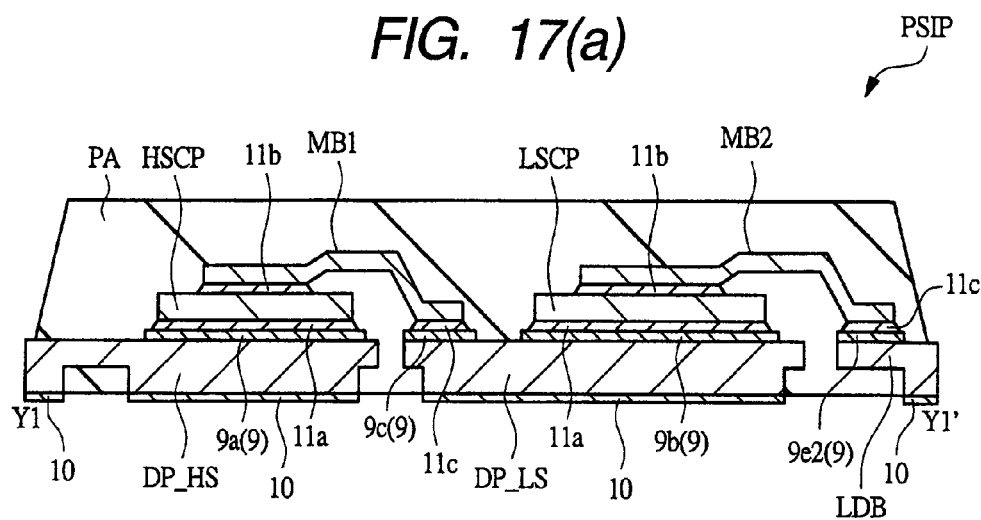
FIG. 17(a) is a cross-sectional view showing an example of a structure taken between Y1 and Y1' of FIG. 16.
Figure 17B:
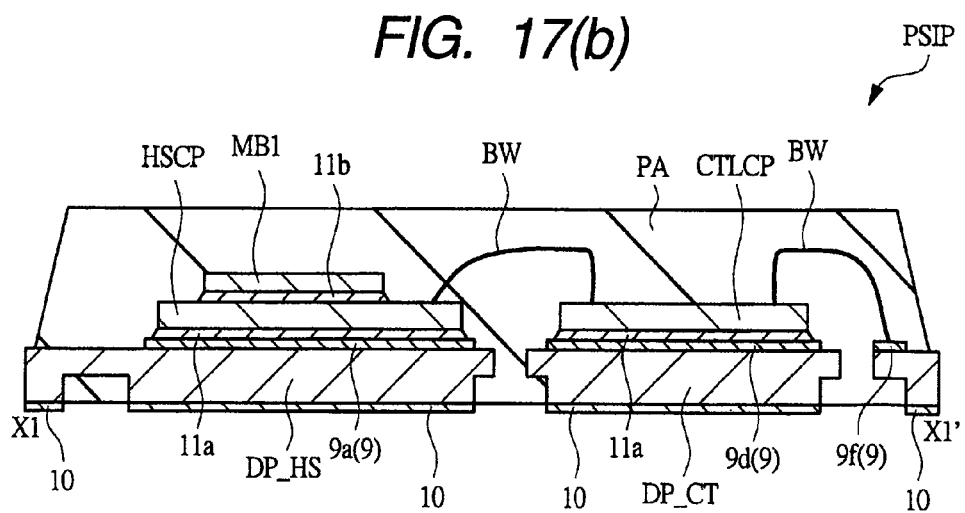
FIG. 17(b) is a cross-sectional view showing an example of a structure taken between X1 and X1' of FIG. 16.

FIG. 16 is a plan view illustrating an outline example of the PWM-equipped drive unit (PSIP) shown in FIG. 14. FIG. 17(a) is a cross-sectional view showing an example of a structure taken between Y1 and Y1' in FIG. 16, and FIG. 17(b) is a cross-sectional view showing an example of a structure taken between X1 and X1' in FIG. 16.

The PWM-equipped drive unit (PSIP) shown in FIG. 16 has, for example, a QFN (Quad Flat Non-leaded package) type surface-mounting semiconductor package (sealing body) PA. A material for the QFN type surface-mounting semiconductor package PA is of, for example, an epoxy resin or the like. The QFN type surface-mounting semiconductor package PA comprises three die pads DP_HS, DP_LS and DP_CT over which semiconductor chips are respectively mounted, a lead wire LDB, and a plurality of leads LD which serve as external terminals. The die pads DP_HS and DP_CT are disposed in one of areas obtained by cutting a plane or planar area in the QFN type surface-mounting semiconductor package PA in half, and the die pad DP_LS and the lead wire LDB are disposed in the other thereof. Both the die pads DP_HS and DP_CT each have an approximately rectangular plane shape and are disposed adjacent to each other. The die pad DP_LS has an approximately rectangular plane shape, and the lead wire LDB has an L-shaped plane shape. The lead wire LDB is disposed between two orthogonal sides in the die pad DP_LS and two orthogonal sides in the QFN type surface-mounting semiconductor package PA.

Plating layers $9a$, $9b$ and $9d$ are respectively formed over the upper surfaces of the die pads DP_HS, DP_LS and DP_CT. Semiconductor chips HSCP, LSCP and CTLCP are mounted via the plating layers $9a$, $9b$ and $9d$. As described in FIG. 14, the semiconductor chip HSCP is formed with the high side transistors (power transistors) QH and QH', the semiconductor chip LSCP is formed with the low side transistor (power transistor) QL, and the semiconductor chip CTLCP is formed with various control circuits other than the above. Here, the area of the semiconductor chip LSCP is designed about twice as large as the area of the semiconductor chip HSCP. When the input power supply voltage VIN of 12V is converted to the output power supply voltage of 1.0V, for example, the time during which the low side transistor QL is turned on, becomes about ten times as long as the time during which the high side transistor QH is turned on. Accordingly, the increase in the area of the semiconductor chip LSCP makes it possible to reduce an on resistance and enhance power efficiency of the power supply device. Each of the die pads DP_HS, DP_LS and DP_CT has a lower surface exposed from the back surface of the QFN type surface-mounting semiconductor package PA. Of these, the exposed area of the die pad DP_LS is the largest, and the exposed area of the die pad DP_HS is next large. Consequently, it is also possible to reduce the on resistance of the low side transistor QL and enhance its heat radiation.

A plating layer $9c$ is also formed over the upper surface of the die pad DP_LS. Further, plating layers $9e1$ and $9e2$ are formed over the upper surface of the lead wire LDB, and a plating layer $9f$ is formed over the upper surface of each lead LD. The respective die pads DP_HS, DP_LS, DP_CT, the lead wire LDB and the leads LD are formed of, for example, a metal such as copper (Cu) as a main material. The respective plating layers $9a$, $9b$, $9c$, $9d$, $9e1$, $9e2$ and $9f$ are, for example, a silver (Ag) plating layer, or a gold (Au) plating layer, or the like.

The semiconductor chip HSCP is provided with a drain electrode at its back surface and provided with a plurality of source electrodes $S1h$ through $S4h$ and a gate electrode Gh at its surface. Thus, the drain electrode is electrically coupled to the die pad DP_HS. The source electrodes $S1h$ through $S4h$ are respectively coupled by internal wirings of the semiconductor chip HSCP. The semiconductor chip LSCP is provided with a drain electrode at its back surface and provided with a plurality of source electrodes S11 through S41 and a gate electrode G1 at its surface. The drain electrode is electrically coupled to the die pad DP_LS. The source electrodes S11 through S41 are respectively coupled by internal wirings of the semiconductor chip LSCP. The semiconductor chip CTLCP is provided with a plurality of electrodes including electrodes $PD1h$, $PD2h$, PD21 and PD11 at its surface. The back surface of the semiconductor chip CTLCP is electrically coupled to the die pad DP_CT.

A plurality (seven herein) of leads (external terminals) LD used for the input power supply voltage VIN, and a lead LD used for a switch signal SW are disposed around the die pad DP_HS. Of these, the leads LD used for the input power supply voltage VIN are formed integrally with the die pad DP_HS. Accordingly, the drain electrode of the semiconductor chip HSCP is electrically coupled to the leads LD for the input power supply voltage VIN via the die pad DP_HS. A plurality (eight herein) of leads LD used for SW are disposed around the die pad DP_LS. The leads LD used for SW are formed integrally with the die pad DP_LS. Accordingly, the drain electrode of the semiconductor chip LSCP is electrically coupled to the leads LD for SW via the die pad DP_LS. Plural (thirteen herein) leads LD for a ground power supply voltage PGND are disposed around the lead wire LDB. The leads LD for the PGND are formed integrally with the lead wire LDB.

A plurality (two herein) of leads LD for a ground power supply voltage SGND are disposed around the die pad DP_CT. The leads LD used for the SGND are formed integrally with the die pad DP_CT. Accordingly, the back surface of the semiconductor chip CTLCP is electrically coupled to the leads LD for the SGND via the die pad DP_CT. Further, leads LD for a clock signal CLK, a current detection signal CS, an internal power supply voltage VDD2, an error amplifier signal EO, a reference current IREF, an internal power supply voltage VDD1 and a boost voltage BOOT are respectively disposed around the die pad DP_CT. These leads LD are respectively coupled to the electrodes provided at the surface of the semiconductor chip CTLCP via the plating layers $9f$ and bonding wires BW.

The package PA shown in FIG. 16 further has two metal plates (conductor plates) MB1 and MB2. The metal plates MB1 and MB2 are formed of a metal high in conductivity and thermal conductivity as typified by copper (Cu), for example. The metal plate MB1 couples the source electrodes $S1h$ an $S2h$ provided over the semiconductor chip HSCP, and the plating layer $9c$ formed on the die pad DP_LS. Consequently, the source of the transistor QH in the semiconductor chip HSCP is coupled to its corresponding lead LD for the switch signal SW. The metal plate MB2 couples the source electrodes S11 through S31 provided over the semiconductor chip LSCP, and the plating layers $9e1$ and $9e2$ formed at the two points over the lead wire LDB respectively. Consequently, the source of the transistor QL in the semiconductor chip LSCP is coupled to its corresponding lead LD for the ground power supply voltage PGND.

The source electrode $S4h$ provided over the semiconductor chip HSCP is coupled via the plating layer $9f$ to the lead LD for the SW disposed around the die pad DP_HS through the bonding wires BW. The gate electrode Gh and source electrode $S3h$ provided over the semiconductor chip HSCP are respectively coupled to the electrodes $PD1h$ and $PD2h$ provided over the semiconductor chip CTLCP via the bonding wires BW. The gate electrode G1 and source electrode S41 provided over the semiconductor chip LSCP are respectively coupled to the electrodes PD11 and PD21 provided over the semiconductor chip CTLCP via the bonding wires BW. The electrodes $PD1h$ and $PD2h$ correspond to an output node and a reference voltage node of the driver DRVh in FIG. 14. The electrodes PD11 and PD21 correspond to an output node and a reference voltage node of the driver DRV1 in FIG. 14.

As shown in FIGS. 17(a) and 17(b), a plating layer 10 is formed over the lower surfaces of the leads LD exposed from the back surface of the package PA and the lower surfaces of the die pads DP_HS, DP_LS and DP_CT. The plating layer 10 corresponds to a solder plating layer and is of a plating layer formed after the formation of the package PA. The plating layer 10 is provided to facilitate solder coupling to a printed circuit board (PCB) when the corresponding PWM-equipped drive unit PSIP is mounted over the PCB. The semiconductor chips HSCP, LSCP and CTLCP are respectively coupled to the plating layers 9a, 9b and 9d via an adhesive or bonding layer 11a, and the semiconductor chips HSCP and LSCP are respectively coupled to the metal plates MB1 and MB2 via an adhesive layer 11b. The metal plate MB1 is coupled to the plating layer 9c through the adhesive layer 11b, and the metal plate MB2 is coupled to the plating layer 9e2 (9e1) through an adhesive layer 11c. The adhesive layers 11a through 11c are formed by solder. Each bonding wire BW extending from the semiconductor chip CTLCP is coupled to its corresponding plating layer 9f.

Packaging the plural semiconductor chips into one semiconductor package in this way enables a reduction in wiring parasitic inductance in addition to the implantation of a size reduction in the power supply device. Therefore, it is also possible to realize high frequency performance and an increase in efficiency. A reduction in the resistance of each electrode and an improvement in its heat radiation can be achieved by exposing each of the lower surfaces of the die pads DP_HS, DP_LS and DP_CT as the electrode from the back surface of the package PA. Further, the coupling using the two metal plates (conductor plates) MB1 and MB2 enables a reduction in the resistance of the corresponding coupling portion and an improvement in its heat radiation as compared with the case in which the bonding wires BW are used.

Figure 18:
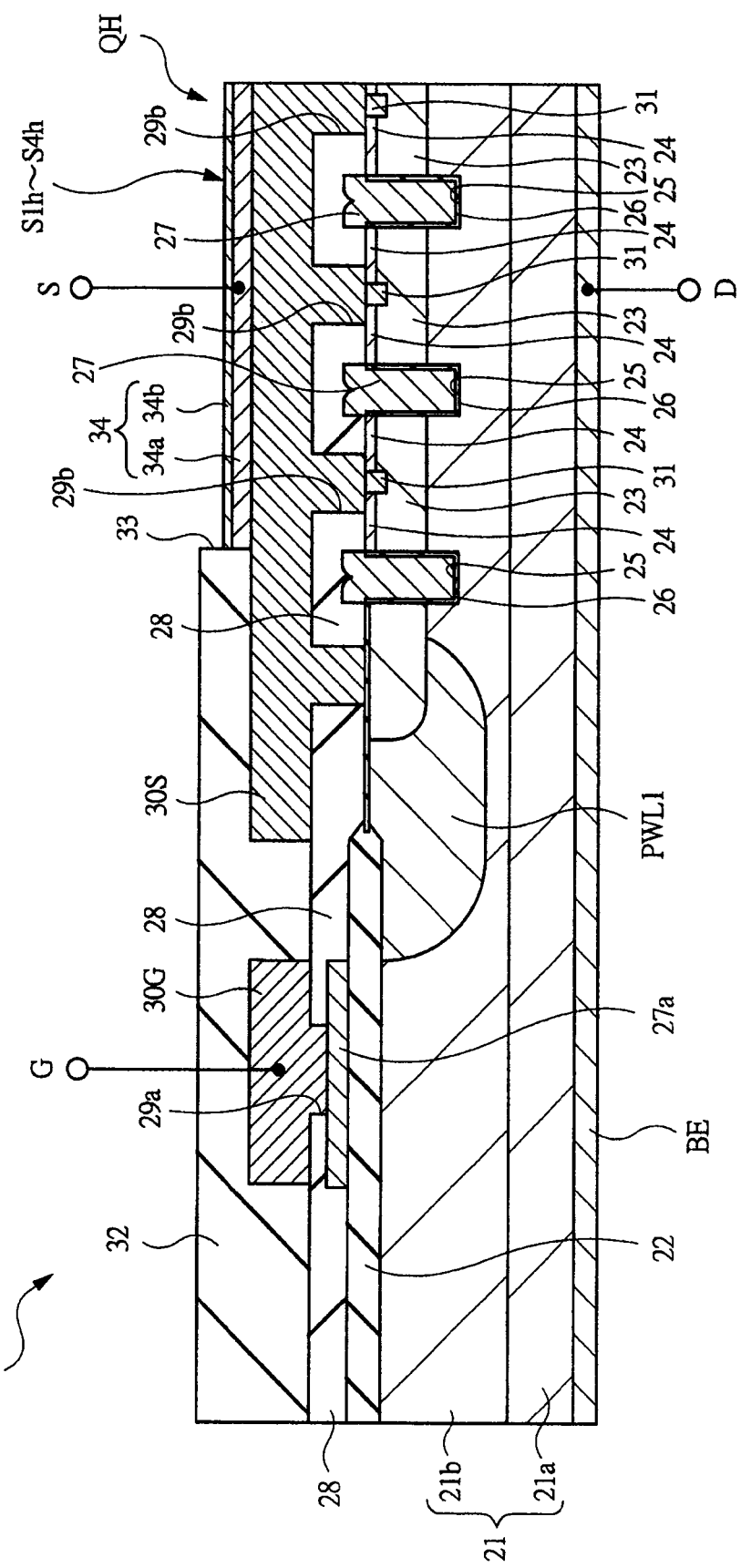
FIG. 18 is a cross-sectional view showing a device structure example of a semiconductor chip formed with high side power transistors in FIG. 14.

FIG. 18 is a cross-sectional view showing a device structure example of the semiconductor chip HSCP formed with the high side transistors (power transistors) in FIG. 14. Although the high side transistors QH and QH' are illustrated by way of example herein, the low side transistor QL also takes a similar structure. The high side transistors QH and QH' are formed in a main surface of a semiconductor substrate 21 having a substrate main body 21a comprised of n$^+$ type monocrystalline silicon or the like and an epitaxial layer 21b comprised of an n$^-$ type silicon monocrystal. A field insulating film (device isolation region) 22 comprised of, for example, silicon oxide is formed over a main surface of the epitaxial layer 21b.

A plurality of unit transistor cells that configure the transistors QH and QH' are formed in an active region surrounded by the field insulating film 22 and a p-type well PWL1 lying therebelow. The transistor QH is formed by coupling these unit transistor cells in parallel. On the other hand, the transistor QH' is formed by setting the number of the parallel-coupled unit transistor cells to 1/18500 or the like of the number of the unit transistor cells for the transistor QH. Each unit transistor cell is formed by, for example, an n channel power MOS transistor having a trench gate structure.

The substrate main body 21a and the epitaxial layer 21b have a function as a drain region of each unit transistor cell mentioned above. A back electrode BE for a drain electrode is formed over the back surface of the semiconductor substrate 21. The back electrode BE is formed by stacking a titanium (Ti) layer, a nickel (Ni) layer and a gold (Au) layer in order from the back surface of the semiconductor substrate 21, for example. In the PWM-equipped drive unit PSIP shown in FIGS. 17(a) and 17(b), the back electrode BE is bonded onto the die pad DP_HS (plating layer 9a) via the adhesive layer 11a and electrically coupled thereto.

Each p-type semiconductor region 23 formed in the epitaxial layer 21b has a function as a channel forming region of the unit transistor cell. Further, each n$^+$ type semiconductor region 24 formed over the p-type semiconductor region 23 has a function as a source region of the unit transistor cell. Trenches 25 each extending in the direction of thickness of the semiconductor substrate 21 from its main surface are formed in the semiconductor substrate 21. Each of the trenches 25 is formed so as to extend through the n$^-$ type semiconductor region 24 and the p-type semiconductor region 23 from the upper surface of the n$^+$ type semiconductor region 24 and terminate within the epitaxial layer 21b lying therebelow. A gate insulating film 26 comprised of, for example, silicon oxide is formed over a bottom surface and side surfaces of each trench 25.

A gate electrode 27 is embedded within the trench 25 through the gate insulating film 26. The gate electrode 27 is comprised of, for example, a polycrystalline silicon film added with an n-type impurity. The gate electrode 27 has a function as the gate electrode of the unit transistor cell. A gate lead-out wiring portion 27a comprised of a conductive film of the same layer as the gate electrode 27 is formed even at a part lying over the field insulating film 22. The gate electrode 27 and the gate lead-out wiring portion 27a are formed integrally with each other and electrically coupled to each other. Incidentally, each gate electrode 27 and the gate lead-out wiring portion 27a are integrally coupled to each other in a region not shown in the cross-sectional view of FIG. 18. The gate lead-out wiring portion 27a is electrically coupled to its corresponding gate wiring 30G through a contact hold 29a defined in an insulating film 28 which covers the gate lead-out wiring portion 27a.

On the other hand, a source wiring 30S is electrically coupled to the n$^+$ type semiconductor region 24 for the source through each contact hole 29b formed in the insulating film 28. The source wiring 30S is electrically coupled to p type semiconductor regions 31 each located above the p type semiconductor region 23 and formed between the adjacent n$^+$ type semiconductor regions 24 and electrically coupled to the channel-forming p-type semiconductor regions 23 therethrough. The gate wiring 30G and the source wiring 30S can be formed by forming a metal film (e.g., aluminium film) so as to bury the contact holes 29a and 29b over the insulating film 28 formed with the contact holes 29a and 29b defined therein and patterning the metal film.

The gate wiring 30G and the source wiring 30S are covered with a protective film (insulating film) 32 comprised of a polyimide resin or the like. The protective film 32 is of a top layer film (insulating film) of the semiconductor chip HSCP. Such an opening 33 as to expose some of the gate wiring 30G and/or the source wiring 30S lying below the protective layer 32 is formed in part of the protective film 32. A portion of the gate wiring 30G, which is exposed from the opening 33, corresponds to the gate electrode Gh mentioned above, and a portion of the source wiring 30S, which is exposed from the opening 33, corresponds to the source electrodes S1h through S4h referred to above. While the source electrodes S1h through S4h are being isolated by the protective film 32 at the top layer in this way, they are electrically coupled to one another through the source wiring 30S.

A metal layer 34 is formed in the surfaces of the electrodes Gh and S1h through S4h (i.e., over the gate wiring 30G portion and the source wiring 30S portion both exposed at the bottom of the opening 33) by a plating method or the like. The metal layer 34 is formed by a laminated or stacked film of a metal layer 34a formed over the gate wiring 30G and the source wiring 30S and a metal layer 34b formed thereover. The lower metal layer 34a is comprised of, for example, nickel (Ni) and has the function of principally suppressing or preventing the oxidation of aluminum of the underlayer gate wiring 30G and source wiring 30S. The upper metal layer 34b is comprised of, for example, gold (Au) and has the function of principally suppressing or preventing the oxidation of nickel of the underlayer metal layer 34a.

Operating currents of the unit transistor cells for such high side power MOS transistors QH and QH' flow in the direction of thickness of the substrate 21 along the side surfaces (i.e., side surfaces of the trenches 25) of the gate electrodes 27 between the drain epitaxial layer 21b and the source $n^+$ type semiconductor regions 24. That is, channels are formed along the direction of thickness of the semiconductor chip HSCP. Thus, the semiconductor chip HSCP is of a semiconductor chip in which vertical MOSFETs (power MOSFETs) each having a trench type gate structure are formed. Here, the vertical MOSFET corresponds to a MOSFET at which a source-to-drain current flows in the direction (direction approximately perpendicular to the main surface of the semiconductor substrate) of thickness of the semiconductor substrate (substrate 21).

Figure 19A:
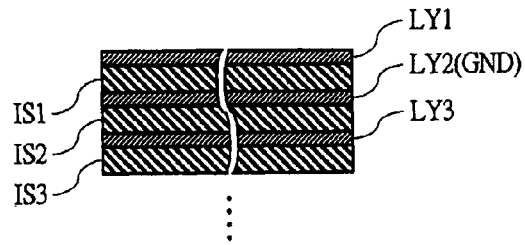
Figure 19B:
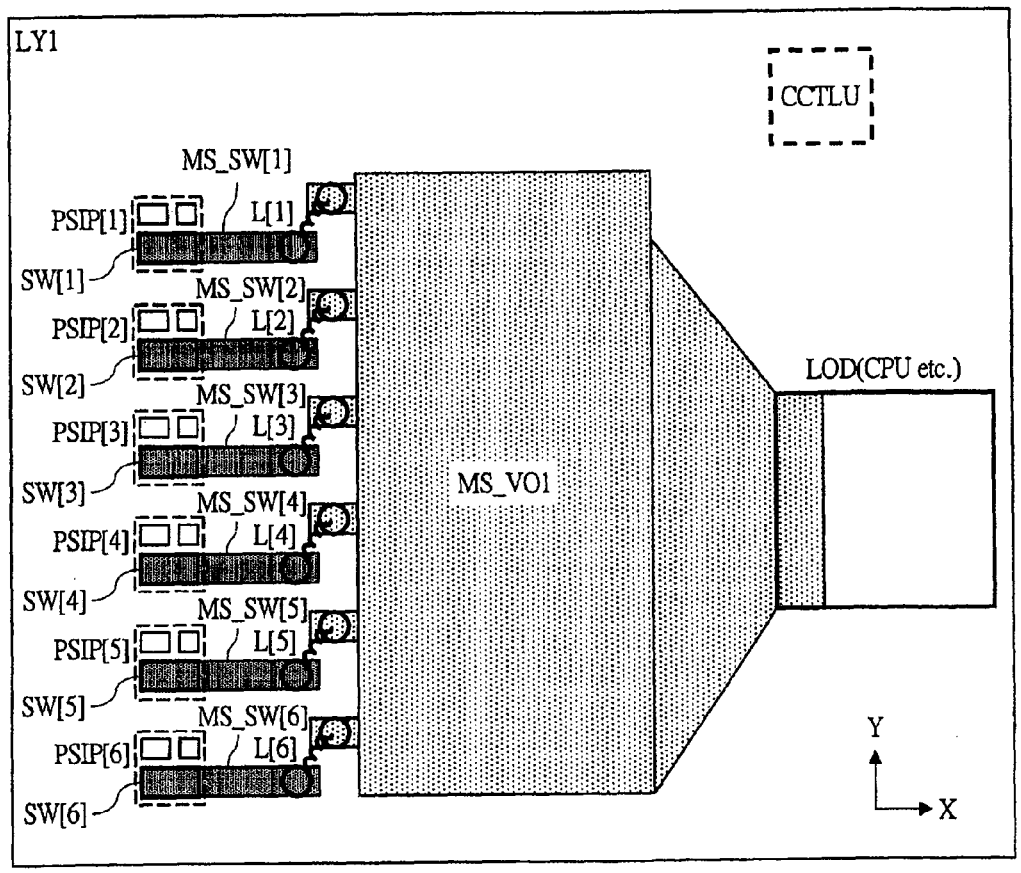
Figure 20A:
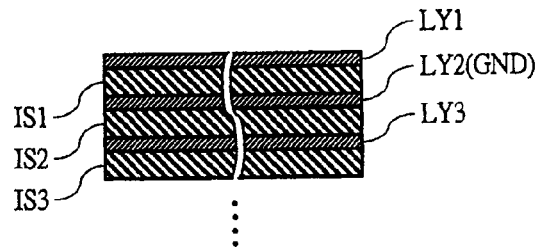
Figure 20B:
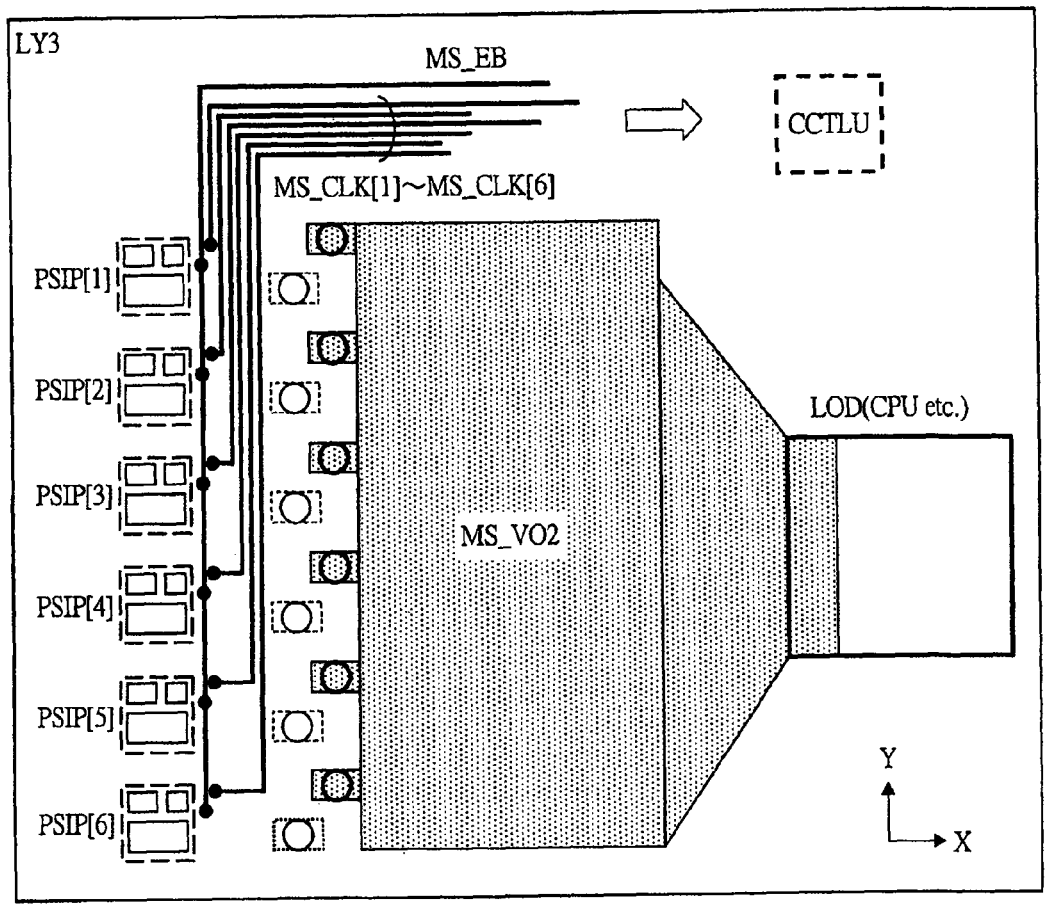

FIGS. 19(a) and 19(b) and FIGS. 20(a) and 20(b) respectively show configuration examples where the power supply device shown in FIG. 13 is mounted over the printed circuit board (PCB), in which FIGS. 19(a) and 20(a) are respectively cross-sectional views each showing part of wiring layers at the printed circuit board, and FIGS. 19(b) and 20(b) are respectively plan views each showing a layout example of each wiring layer in each of FIGS. 19(a) and 20(a). For example, three layers at the printed circuit board (PCB) provided with a plurality of wiring layers are shown in FIG. 19(a). In FIG. 19(a), a first wiring layer LY1, a second wiring layer LY2 and a third wiring layer LY3 are provided toward the lower layer. Insulating layers IS1, IS2 and IS3 are respectively provided between the first wiring layer LY1 and the second wiring layer LY2, between the second wiring layer LY2 and the third wiring layer LY3 and below the third wiring layer LY3. Here, the second wiring layer LY2 is assumed to be a ground voltage GND layer. Although not limited in particular, each wiring layer is formed with, for example, copper (Cu) as a material.

As shown in FIG. 19(b), a plurality (six herein) of PWM-equipped drive units PSIP[1] through PSIP[6], a load LOD such as a CPU, etc., a common control unit CCTLU, and a plurality (six herein) of inductors L[1] through L[6] are mounted in the first wiring layer LY1. Here, the PWM-equipped drive units PSIP[1] through PSIP[6] and the common control unit CCTLU are assumed to have discrete semiconductor packages. An approximately rectangular power plane MS_VO1 having a large area is formed next to the load LOD as viewed in an X direction. An approximately rectangular one side of the power plane MS_VO1 is coupled to a power supply terminal of the load LOD. At the power plane MS_VO1, six coupling nodes are formed in order in a Y direction along an approximately rectangular one side opposite to the LOD side. One ends of the six inductors L[1] through L[6] are respectively coupled to the coupling nodes.

On the other hand, the PWM-equipped drive units PSIP[1] through PSIP[6] are mounted in order in the Y direction in an area opposite to the load LOD with the power plane MS_VO1 interposed between the load LOD and the area as viewed in the X direction. As described in FIG. 16 and the like, the respective PWM-equipped drive units PSIP[n] are respectively provided, at the back surface, with the external terminals from which the switch signals SW[n] are outputted. Thus, the respective external terminals (SW[1] through SW[n]) are disposed in order in the Y direction, and switch signal wirings MS_SW[1] through MS_SW[6] are formed so as to extend in the X direction in which the MS_VO1 exists, from the respective external terminals. The other ends of the six inductors L[1] through L[6] are respectively coupled to the ends of the switch signal wirings MS_SW[1] through MS_SW[6]. Incidentally, the common control unit CCTLU is mounted to a position different from that for the load LOD in the Y direction.

On the other hand, as shown in FIG. 20(b), an error bus wiring MS_EB, which couples external terminals for an error amplifier signal EO at the respective PWM-equipped drive units PSIP[n] in common and extend in the Y direction, is formed in the third wiring layer LY3. Six clock signal wirings MS_CLK[1] through MS_CLK[6], which are coupled to external terminals for clock signals CLK[n] at the respective PWM-equipped drive units PSIP[n] and respectively extend in the Y direction, are formed in the third wiring layer LY3. These seven wirings (MS_EB and MS_CLK[1] through MS_CLK[6]) extend to the common control unit CCTLU. An approximately rectangular power plane MS_VO2 having a large area in a manner similar to the first wiring layer LY1, is further formed in the third wiring layer LY3.

Stabilization of the power supply voltage and an improvement in heat radiation at the load, etc. can be achieved by sufficiently ensuring the areas of the power planes MS_VO1 and MS_VO2 in this way. Sufficiently ensuring the areas of wiring paths (MS_SW[n]) extending from the respective PSIP[n] to the power plane MS_VO1 through the inductors L[n] enables reductions in the resistances of the wiring paths along which large current flows, an improvement in their heat radiation, etc. Incidentally, it is feasible to ensure the sufficient areas in this way because the number of the signal wirings is small as shown in FIG. 20(b). Since the number of the signal wirings is small, noise such as wiring mutual crosstalk, etc. can also be reduced.

Figure 23A:
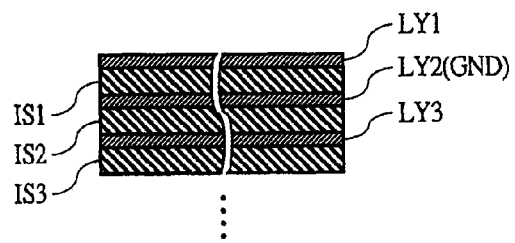
FIGS. 23(a) and 23(b) show, as a comparative example of FIGS. 19(a) and 19(b), a configuration example of a printed circuit board where the configuration example of FIG. 22(a) is used.
Figure 23B:
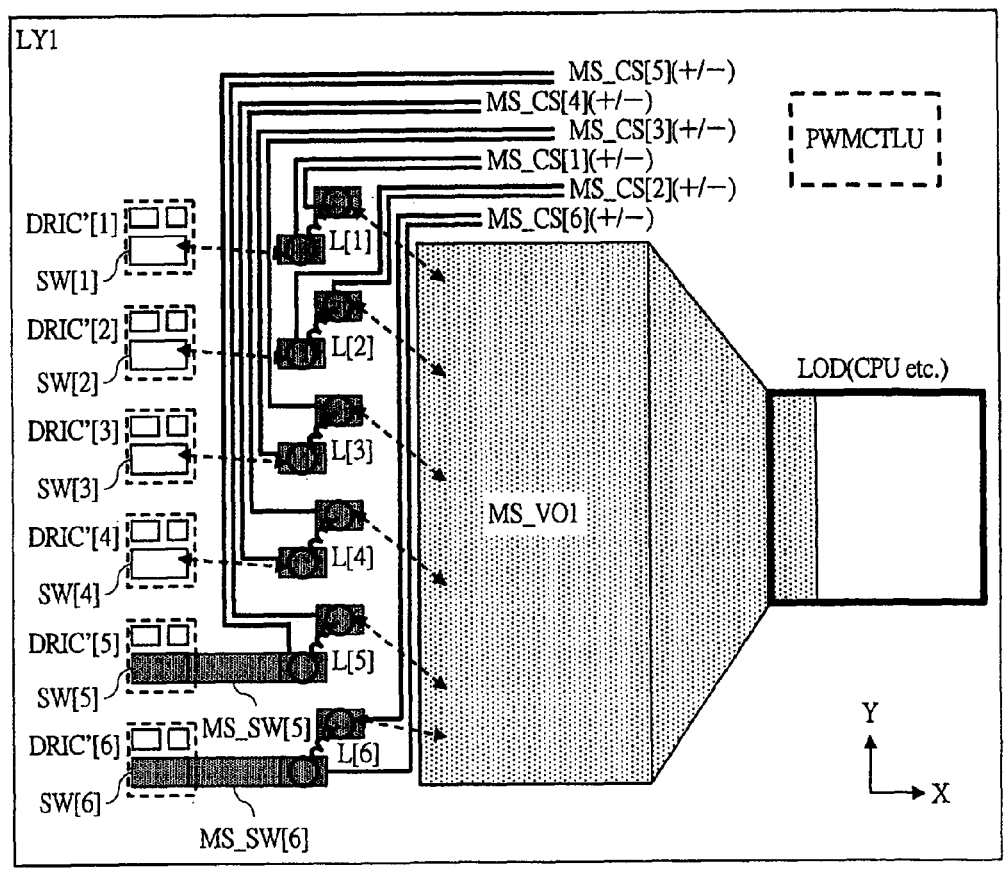
Figure 24A:
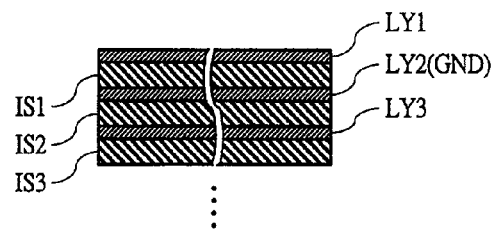
FIGS. 24(a) and 24(b) show, as a comparative example of FIGS. 20(a) and 20(b), a configuration example of a printed circuit board where the configuration example of FIG. 22(a) is used.

FIGS. 23(a) and 23(b) show, as a comparative example of FIGS. 19(a) and 19(b), a configuration example of a printed circuit board where the configuration example shown in FIGS. 22(a) and 22(b) is used. FIG. 24 shows, as a comparative example shown in FIGS. 20(a) and 20(b), a configuration example of a printed circuit board where the configuration example shown in FIGS. 22(a) and 22(b) is used. When the configuration example shown in FIGS. 22(a) and 22(b) is used, twelve current detection signal wirings MS_CS[n](+/−) that extend from both ends of inductors L[n] to a PWM control unit PWMCTLU are required as shown in FIG. 23(b). It is therefore not possible to sufficiently ensure wiring paths between a power plane MS_VO1 and the inductors L[n] and wiring paths between outputs (corresponding to SW[n]) of drive units DRIC'[n] and the inductors L[n].

Figure 24B:
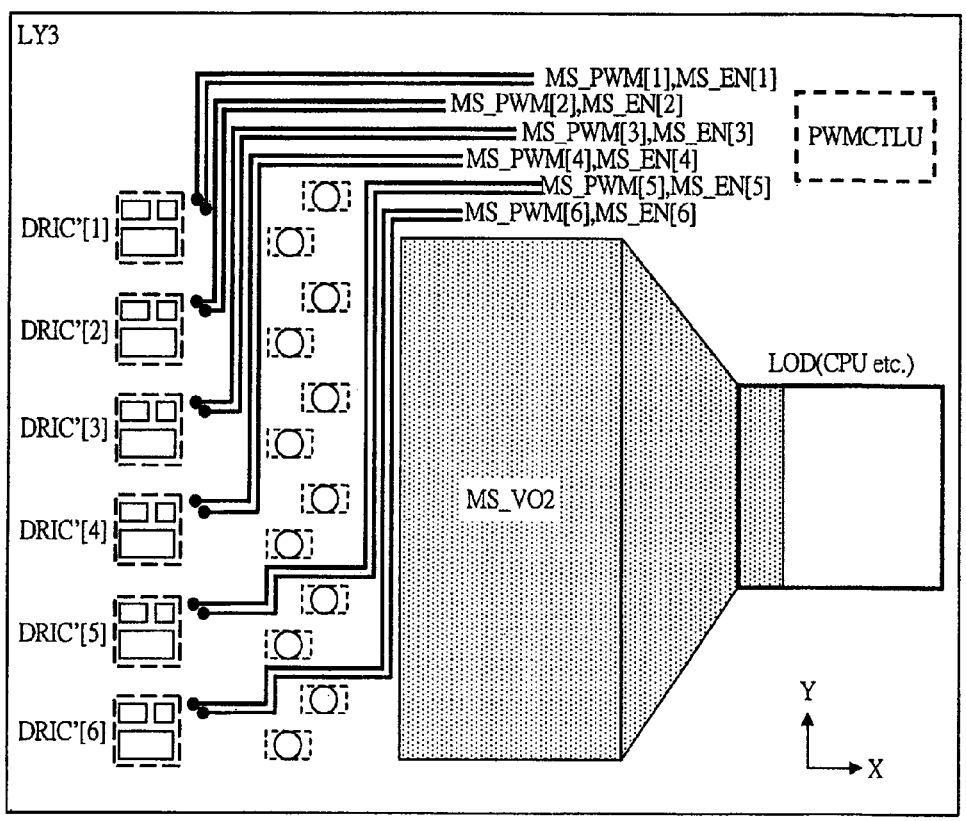

When the configuration example shown in FIGS. 22(a) and 22(b) is used, six PWM signal wirings MS_PWM[1] through MS_PWM[6] and six enable signal wirings MS_EN[1] through MS_EN[n] both extending from respective DRIC'[n] to a PWM control unit PWMCTLU are required as shown in FIG. 24(b). Accordingly, the areas of the power planes MS_VO1 and MS_VO2 are also limited by these many wirings (24 in total). These result in the need for further wirings using wiring layers and the occurrence of a scale-up of the size of the power supply device, an increase in its cost, and the like.

Figure 26A:
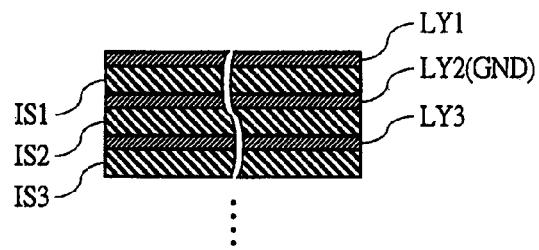
FIGS. 26(a) and 26(b) show, as a comparative example of FIGS. 19(a) and 19(b), a configuration example of a printed circuit board where the configuration example of FIG. 25(a) is used.
Figure 26B:
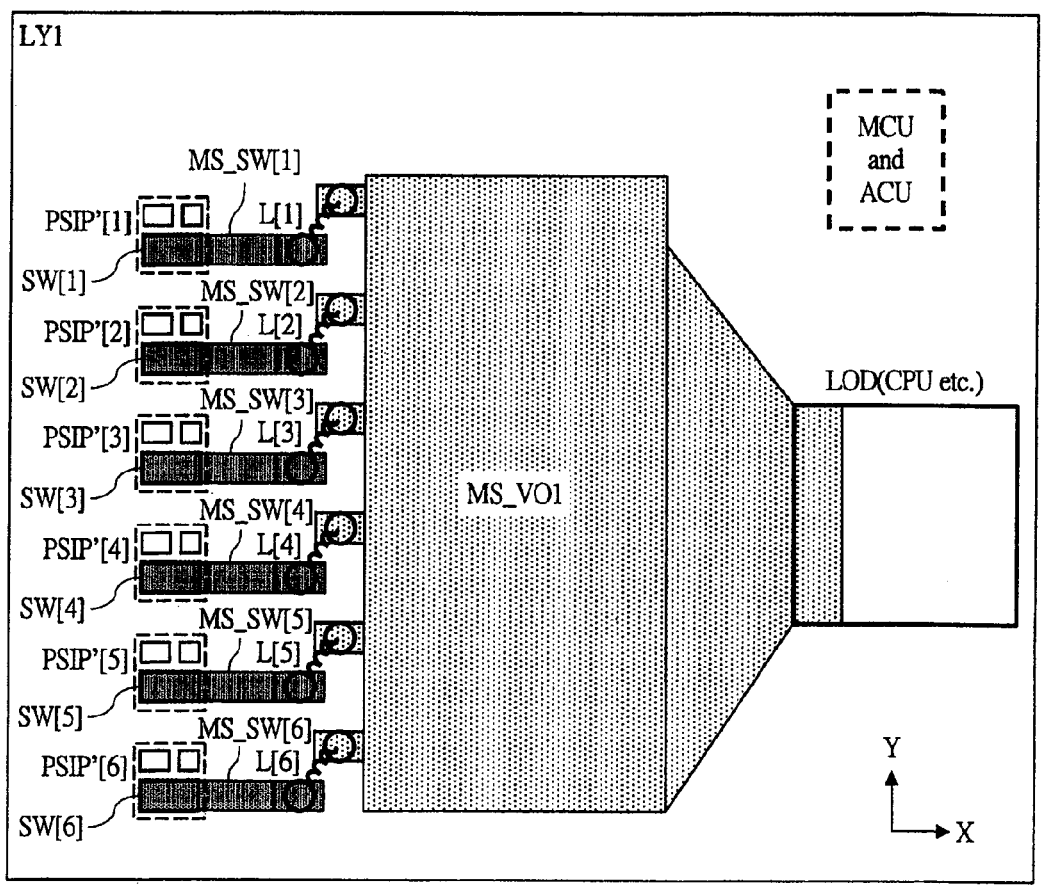
Figure 27A:
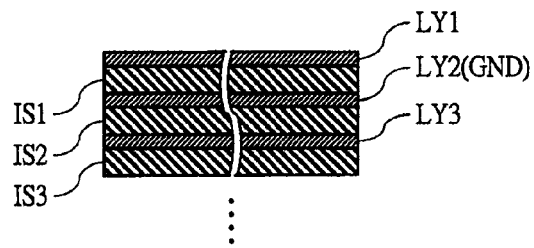
FIGS. 27(a) and 27(b) show, as a comparative example of FIGS. 20(a) and 20(b), a configuration example of a printed circuit board where the configuration example of FIG. 25(a) is used.
Figure 27B:
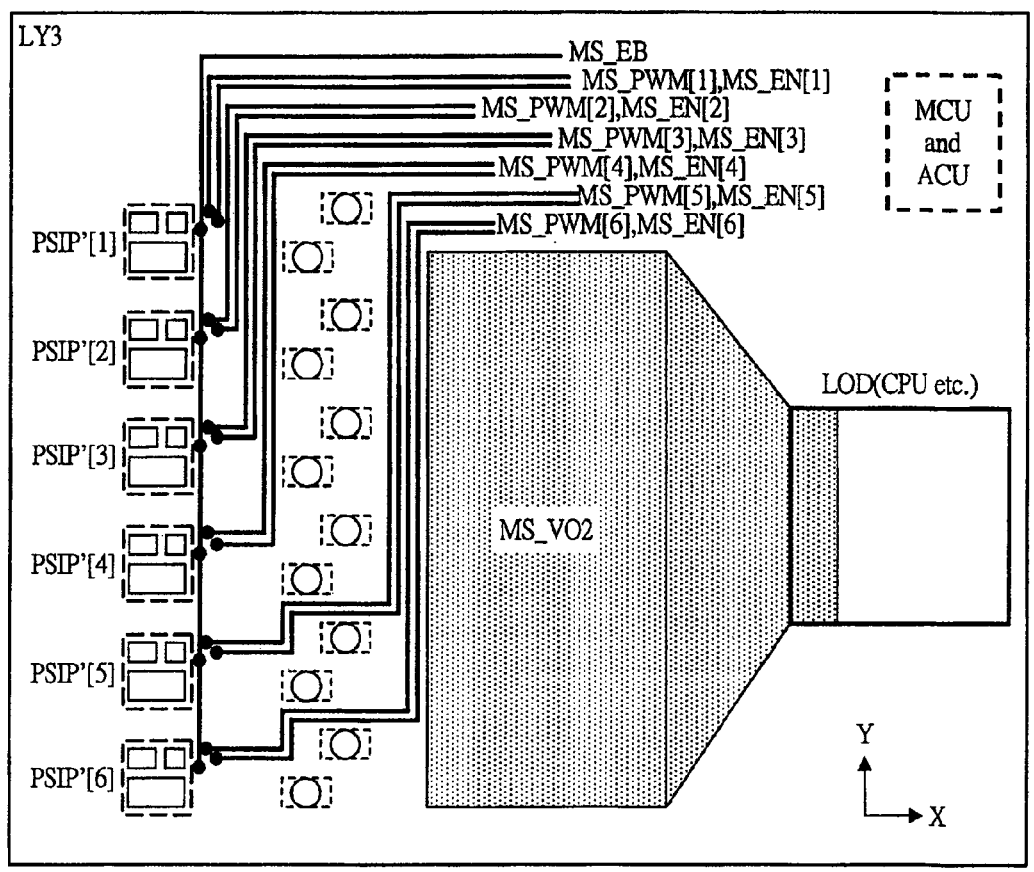

FIGS. 26(a) and 26(b) show, as a comparative example of FIG. 19, a configuration example of a printed circuit board where the configuration example shown in FIGS. 25(a) and 25(b) is used, and FIGS. 27(a) and 27(b) show, as a comparative example shown in FIGS. 20(a) and 20(b), a configuration example of a printed circuit board where the configuration example shown in FIGS. 25(a) and 25(b) is used. When the configuration example shown in FIGS. 25(a) and 25(b) is used, a configuration similar to that in FIG. 19(b) can be implemented at a first wiring layer LY1 as shown in FIG. 26(b). As shown in FIG. 27(b), however, wirings equal to thirteen in total are necessary for a third wiring layer LY3 from respective PWM-equipped drive units PSIP'[n] to a microcontroller unit MCU and an analog companion unit ACU. The thirteen wirings correspond to six clock signal wirings MS_CLK][1] through MS_CLK[6], six enable signal wirings MS_EN[1] through MS_EN[n], and a single error bus wiring MS_EB. Accordingly, the area of a power plane MS_VO2 is restricted by these many wirings, so that it becomes hard to achieve stabilization of a power supply voltage, an improvement in heat radiation, and the like Incidentally, although omitted in the configuration examples shown in FIGS. 23(a) and 23(b), 24(a) and 24(b), 26(a) and 26(b) and 27(a) and 27(b), there is a fear that wirings for respective input voltage detection signals UVLO [n] might also further be added to these configuration examples where such a system as described in the third embodiment (FIG. 7 and the like) is not used.

Using the power supply device according to the fifth embodiment from above, the effect of reducing the number of the wirings employed in the first embodiment and the like, and the effect of reducing the number of the wirings employed in the third embodiment, and the like can be made compatible, thus making it possible to a further size reduction in the power supply device.

While the invention made above by the present inventors has been described specifically on the basis of the preferred embodiments, the present invention is not limited to the embodiments referred to above. Various changes can be made thereto within the scope not departing from the gist thereof.

For example, such a system that the enable signal is shared for each clock signal described in the first embodiment and the like can also be applied to such a configuration example as shown in FIGS. 22(a) and 22(b). In a manner similar to the above even in this case, the PWM signals PWM[1] through PWM[6] may be brought to, for example, high impedance to thereby transmit the enable signals. The combination of each unit (MCU, ACU or PSIP[n]) and the semiconductor package can be modified as appropriate in FIGS. 1(a) and 1(b). For example, two PSIP may be mounted in one semiconductor package or all units may also be mounted in one semiconductor package using a SiP technology or the like where the number of phases to be realize is small. Since the number of semiconductor chips to be coupled therebetween in the semiconductor package can be reduced by using the power supply device according to the present embodiment, this case becomes also useful. Although the resistors R1 and R2 are provided on the side of each PSIP[n] in the configuration examples shown in FIGS. 3 and 5 to thereby generate the middle level, the resistors may also be provided on the MCU side to generate the corresponding middle level.

What is claimed is:

1. A power supply device comprising:
a printed circuit board;
an output power supply node configured to couple with a load;
a plurality of semiconductor devices configured to drive the load;
a plurality of inductors each of which are coupled to the output power supply node and one of the plurality of semiconductor devices, respectively;
an error bus coupled to the plurality of semiconductor devices;
a microcontroller configured to provide a plurality of first control signals to the plurality of semiconductor devices; and
an error amplifier configured to output a common error amplifier signal to each of the plurality of semiconductor devices via the error bus, the common error amplifier signal being generated based on a voltage of the output power supply node,
wherein the microcontroller and the error amplifier are formed in a first semiconductor chip disposed over the printed circuit board,
wherein each of the semiconductor devices is formed in a second semiconductor chip disposed over the printed circuit board, and
wherein each of the plurality of the semiconductor devices respectively comprises:
a first transistor having a gate and a drain-source path;
a second transistor having a gate and a drain-source path which is coupled to the drain-source path of the first transistor;
a first detection circuit configured to receive a respective one of the first control signals having a first frequency and a first phase, and generate a first internal control signal and a first enable signal based on a voltage state of the respective one of the first control signals; and
a PWM control circuit configured to receive the common error amplifier signal and drive the first transistor and the second transistor by pulse width modulation (PWM) control in accordance with the first internal control signal when the first enable signal is in an active state, and fixes the first transistor and the second transistor to off when the first enable signal is in an inactive state.

2. The power supply device according to claim 1, wherein each of the inductors is coupled to a respective one of the plurality of semiconductor devices between the drain-source path of the first transistor and the drain-source path of the second transistor.

3. The power supply device according to claim 1, wherein the first detection circuit comprises:
a first level setting circuit which sets a voltage level at which the respective one of the first control signals is in a high impedance state, to a middle level between a high level and a low level;
a first comparator circuit which detects the middle level; and
a first buffer circuit which outputs the first internal control signal according to an output of the first comparator circuit,
wherein the first enable signal is inactivated when the middle level is detected by the first comparator circuit, and
wherein the first buffer circuit fixes the first internal control signal to a high level or a low level when the first enable signal is in the inactive state, and redrives the respective one of the first control signals when the first enable signal is in the active state, to thereby output the first internal control signal.

4. The power supply device according to claim 3, wherein the first level setting circuit comprises:
a first resistance dividing circuit which sets the middle level by resistance voltage division between a second power supply voltage smaller than a first power supply voltage and a ground power supply voltage; and
a first switch inserted in series into the first resistance dividing circuit, and wherein the first switch is controlled to off when the first enable signal is inactivated.

5. The power supply device according to claim 3, wherein each of the plurality of the semiconductor devices respectively further comprises:
- a first bias current generating circuit which generates bias currents necessary for respective internal circuits including the PWM control circuit,
- wherein the first bias current generating circuit stops the generation of some or all of the bias currents when the first enable signal is inactivated.

6. The power supply device according to claim 1,
wherein the semiconductor devices are mounted in one semiconductor package.

7. The power supply device according to claim 6,
wherein the first control signals are clock signals, and
wherein the respective PWM control circuit of each of the plurality of the semiconductor devices detects a current flowing through the first transistor as a first current detection signal and compares the first current detection signal with the common error amplifier signal to thereby determine a duty in the PWM control.

8. The power supply device according to claim 7, wherein each of the plurality of the semiconductor devices respectively further comprises:
- a first voltage detection circuit which activates a first voltage detection signal when a first power supply voltage is higher than a predetermined voltage; and
- a first switch which couples the error bus to a fixed voltage by being controlled to on when the first voltage detection signal is being inactivated, and decouples the error bus and the fixed voltage from each other by being controlled to off when the first voltage detection signal is activated, and
wherein the PWM control circuit further drives on/off of the first transistor by PWM control in accordance with the respective one of the first control signals when the first voltage detection signal is being activated.

* * * * *